(12) United States Patent  
Tachi

(10) Patent No.: US 12,283,544 B2  
(45) Date of Patent: Apr. 22, 2025

(54) SEMICONDUCTOR STORAGE DEVICE

(71) Applicant: KIOXIA CORPORATION, Tokyo (JP)

(72) Inventor: Kiichi Tachi, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 123 days.

(21) Appl. No.: 17/403,678

(22) Filed: Aug. 16, 2021

(65) Prior Publication Data

US 2022/0262720 A1 Aug. 18, 2022

(30) Foreign Application Priority Data

Feb. 18, 2021 (JP) .................................. 2021-024339

(51) Int. Cl.
*H01L 23/528* (2006.01)
*H10B 43/27* (2023.01)

(52) U.S. Cl.
CPC ........... *H01L 23/528* (2013.01); *H10B 43/27* (2023.02)

(58) Field of Classification Search
CPC ... H01L 23/528; H01L 27/0207; H10B 43/27; H10B 43/50; H10B 43/10
See application file for complete search history.

(56) References Cited

U.S. PATENT DOCUMENTS

| | | | |
|---|---|---|---|
| 8,822,285 B2 | 9/2014 | Hwang et al. | |
| 10,903,237 B1 * | 1/2021 | Hosoda | H01L 23/5283 |
| 11,081,443 B1 * | 8/2021 | Mizutani | H10B 43/27 |
| 2017/0200676 A1 * | 7/2017 | Jeong | H10B 41/35 |
| 2018/0261575 A1 | 9/2018 | Tagami et al. | |
| 2020/0006377 A1 * | 1/2020 | Chu | H10B 43/27 |
| 2020/0161326 A1 * | 5/2020 | Oh | H10B 43/50 |
| 2020/0251491 A1 * | 8/2020 | Ozawa | H01L 21/0274 |
| 2020/0303407 A1 * | 9/2020 | Miyazaki | H01L 23/5226 |
| 2021/0151455 A1 * | 5/2021 | Xu | H01L 23/535 |
| 2022/0102273 A1 * | 3/2022 | Kubo | H01L 21/76816 |
| 2023/0038557 A1 * | 2/2023 | Ogawa | H10B 43/10 |

FOREIGN PATENT DOCUMENTS

JP 2018-148071 9/2018

* cited by examiner

*Primary Examiner* — Galina G Yushina
(74) *Attorney, Agent, or Firm* — Kim & Stewart LLP

(57) ABSTRACT

A semiconductor storage device includes a first stacked region, a second stacked region, and a connection region arranged between the first and second stacked regions. In the connection region, one of a plurality of conductor layers in an upper stepped portion is connected to one of the plurality of conductor layers in the first stacked region via one of the plurality of conductor layers in a bridge portion.

20 Claims, 35 Drawing Sheets

SEMICONDUCTOR STORAGE DEVICE

CROSS-REFERENCE TO RELATED APPLICATION(S)

This application is based upon and claims the benefit of priority from Japanese Patent Application No. 2021-024339, filed Feb. 18, 2021, the entire contents of which are incorporated herein by reference.

FIELD

Embodiments described herein relate generally to a semiconductor storage device.

BACKGROUND

In a semiconductor storage device such as a NAND type flash memory, a plurality of conductor layers are stacked and memory pillars are formed extending through the plurality of conductor layers. The intersections between each conductor layer and memory pillar forms a memory cell for storing data. The conductor layers are used as a word line or the like for applying a voltage to a gate electrode of the memory cells.

It is necessary to connect each conductor layer functioning as the word line to a different contact extending along the stacking direction. To achieve this, the conductor layers are typically formed in a stair-stepped structure in a region adjacent to a region where the plurality of memory pillars are formed.

DETAILED DESCRIPTION

Figure 1:
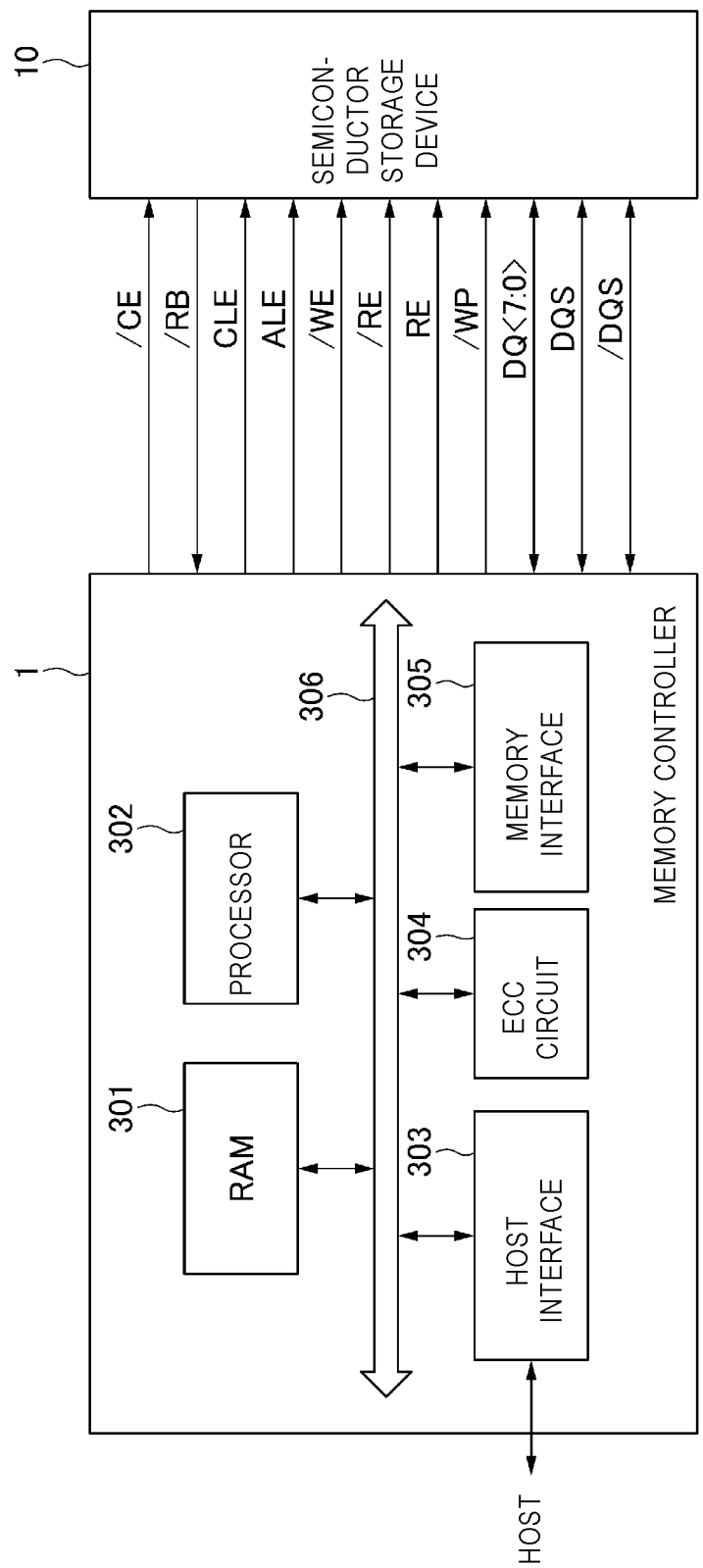
FIG. 1 is a block diagram illustrating a configuration example of a memory system according to a first embodiment.

Embodiments provide a semiconductor storage device with improved performance.

In general, according to an embodiment, a semiconductor storage device includes first, second, and third stacked regions. The first stacked region includes a plurality of conductor layers stacked in a first direction. The second stacked region includes the plurality of conductor layers aligned with the first stacked region along a second direction intersecting the first direction. The third stacked region includes the plurality of conductor layers and arranged between the first stacked region and the second stacked region. The third stacked region includes a first stacked subregion and a second stacked subregion above the first stacked subregion. The first stacked subregion includes a first stair portion adjacent to the second stacked region in the second direction and a first bridge portion adjacent to the first stair portion in a third direction intersecting the first direction and the second direction. The second stacked subregion includes a contact pass-through portion through which a contact extending from one of the conductor layers in the first stair portion passes, a second stair portion between the contact pass-through portion and the first stacked region, and a second bridge portion adjacent to the second stair portion in the third direction. One of the plurality of conductor layers in the second stair portion is connected to one of the plurality of conductor layers in the first stacked region through one of the plurality of conductor layers in the second bridge portion, but not otherwise directly connected to the one of the plurality of conductor layers in the first stacked region.

Hereinafter, the certain example embodiments will be described with reference to accompanying drawings. In order to facilitate understanding of descriptions, the same elements in the drawings are denoted with the same reference numerals, and redundant descriptions thereof will be omitted.

A first embodiment will be described. A semiconductor storage device 10 according to the first embodiment is a non-volatile storage device configured as a NAND type flash memory. FIG. 1 illustrates a block diagram of a configuration example of a memory system including the semiconductor storage device 10. This memory system includes a memory controller 1 and the semiconductor storage device 10. Although, in actuality, a plurality of semiconductor storage devices 10 is provided in the memory system of FIG. 1, only one of them is illustrated in FIG. 1. The specific configuration of the semiconductor storage device 10 will be described below. This memory system can be connected to a host. The host is, for example, electronic equipment such as a personal computer or a mobile terminal.

The memory controller 1 controls writing of data into the semiconductor storage device 10 in response to a write request from the host. The memory controller 1 controls reading of data from the semiconductor storage device 10 in response to a read request from the host.

Between the memory controller 1 and the semiconductor storage device 10, signals, such as a chip enable signal/CE, a ready busy signal/RB, a command latch enable signal CLE, an address latch enable signal ALE, a write enable signal/WE, read enable signals RE and/RE, a write protect signal/WP, a signal DQ<7:0> as data, and data strobe signals DQS and /DQS, are transmitted/received.

The chip enable signal/CE is a signal for enabling the semiconductor storage device 10. The ready busy signal/RB is a signal for indicating whether the semiconductor storage device 10 is in a ready state or a busy state. The "ready state" is a state where a command is accepted from the outside. The "busy state" is a state where a command is not accepted from the outside. The command latch enable signal CLE is a signal indicating that the signal DQ<7:0> is a command. The address latch enable signal ALE is a signal indicating that the signal DQ<7:0> is an address. The write enable signal/WE is a signal for taking a received signal into the semiconductor storage device 10, and is asserted whenever a command, an address, or data is received by the memory controller 1. The memory controller 1 instructs the semiconductor storage device 10 to capture the signal DQ<7:0> while the signal/WE is at an "L (Low)" level.

The read enable signals RE and/RE are signals that cause the memory controller 1 to read data from the semiconductor storage device 10. These are used for controlling an operation timing of the semiconductor storage device 10 when, for example, the signal DQ<7:0> is output. The write protect signal/WP is a signal for instructing the semiconductor storage device 10 to prohibit writing and erasure of data. The signal DQ<7:0> is the data transmitted/received between the semiconductor storage device 10 and the memory controller 1, and includes a command, an address, and data. The data strobe signals DQS and/DQS are signals for controlling the timings of input/output of the signal DQ<7:0>.

The memory controller 1 includes a RAM 301, a processor 302, a host interface 303, an ECC circuit 304, and a memory interface 305. The RAM 301, the processor 302, the host interface 303, the ECC circuit 304, and the memory interface 305 are connected to each other via an internal bus 306.

The host interface 303 outputs a request, user data (write data) or so received from the host, to the internal bus 306. The host interface 303 transmits user data read from the semiconductor storage device 10, a response from the processor 302, etc., to the host.

The memory interface 305 controls a process of writing user data or so into the semiconductor storage device 10 and a process of reading user data or so from the semiconductor storage device 10, on the basis of instructions of the processor 302.

The processor 302 performs an overall control of the memory controller 1. The processor 302 is, for example, a CPU, an MPU or the like. When receiving a request from the host via the host interface 303, the processor 302 performs a control according to the request. For example, the processor 302 instructs the memory interface 305 to write user data and a parity into the semiconductor storage device 10 according to a request from the host. The processor 302 instructs the memory interface 305 to read user data and a parity from the semiconductor storage device 10 according to a request from the host.

The processor 302 determines a storage area (a memory area) on the semiconductor storage device 10 in regard to user data stored in the RAM 301. The user data is stored in the RAM 301 via the internal bus 306. The processor 302 performs determination of a memory area, on data per page (page data) as a writing unit. Hereinafter, user data stored in one page of the semiconductor memory device 10 will be also referred to as "unit data." The unit data is generally encoded and then is stored as a codeword in the semiconductor storage device 10. In the present embodiment, encoding is not essential. The memory controller 1 may store the unit data in the semiconductor storage device 10 without encoding, but, FIG. 1 illustrates a configuration where encoding is performed, as one configuration example. When the memory controller 1 does not perform encoding, the page data is consistent with the unit data. One codeword may be generated on the basis of one unit data item, or one codeword may be generated on the basis of divided data when unit data is divided. Also, one codeword may be generated by using a plurality of unit data items.

The processor 302 determines a memory area of the semiconductor storage device 10 as a write destination for each unit data item. A physical address is allocated to the memory area of the semiconductor storage device 10. The processor 302 manages the memory area as the write destination of unit data by using the physical address. The processor 302 specifies the determined memory area (the physical address) and instructs the memory interface 305 to write user data into the semiconductor storage device 10. The processor 302 manages the correspondence between a logical address (a logical address managed by the host) and a physical address of user data. When receiving a read request including a logical address from the host, the processor 302 identifies a physical address corresponding to the logical address, specifies the physical address, and instructs the memory interface 305 to read user data.

The ECC circuit 304 encodes user data stored in the RAM 301 to generate a codeword. The ECC circuit 304 decodes a codeword read from the semiconductor storage device 10.

The RAM 301 temporarily stores user data received from the host until the user data is stored in the semiconductor storage device 10, or temporarily stores data read from the semiconductor storage device 10 until the data is transmitted to the host. The RAM 301 is, for example, a general purpose memory such as a SRAM or a DRAM.

FIG. 1 illustrates a configuration example in which the memory controller 1 includes each of the ECC circuit 304 and the memory interface 305. Alternatively, the ECC circuit 304 may be embedded in the memory interface 305. The ECC circuit 304 may be embedded in the semiconductor storage device 10. The specific configuration or the arrangement of each element illustrated in FIG. 1 is not particularly limited.

When a write request is received from the host, the memory system of FIG. 1 operates as follows. The processor 302 temporarily stores write target data in the RAM 301. The processor 302 reads the data stored in the RAM 301, and inputs the data to the ECC circuit 304. The ECC circuit 304 encodes the input data, and inputs a codeword to the memory interface 305. The memory interface 305 writes the input codeword into the semiconductor storage device 10.

When a read request is received from the host, the memory system of FIG. 1 operates as follows. The memory interface 305 inputs a codeword read from the semiconductor storage device 10, to the ECC circuit 304. The ECC circuit 304 decodes the input codeword, and stores the decoded data in the RAM 301. The processor 302 transmits the data stored in the RAM 301 to the host via the host interface 303.

Figure 2:
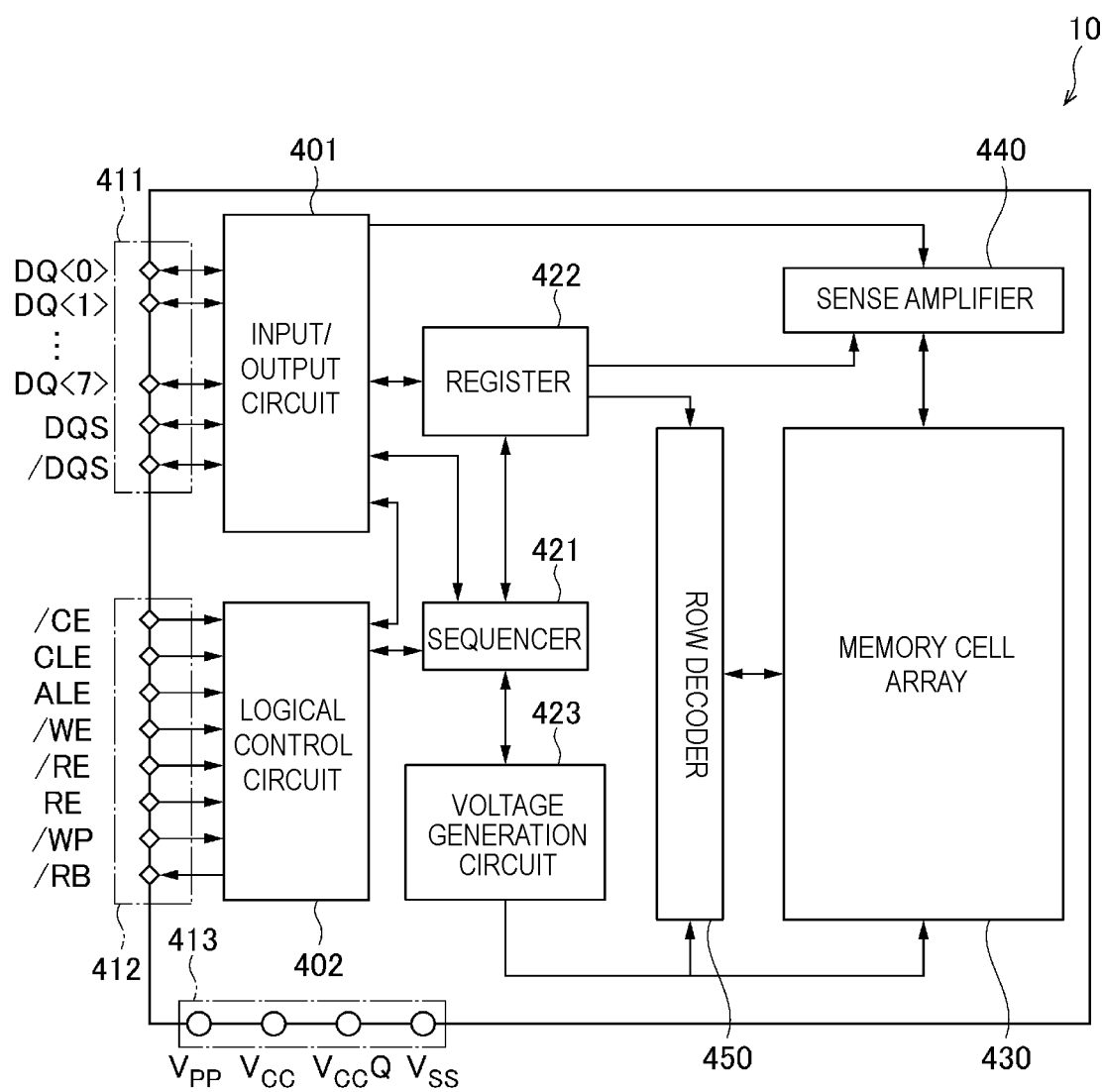
FIG. 2 is a block diagram illustrating the configuration of a semiconductor storage device according to a first embodiment.

The configuration of the semiconductor storage device 10 will be described. As illustrated in FIG. 2, the semiconductor storage device 10 includes a memory cell array 430, a sense amplifier 440, a row decoder 450, an input/output circuit 401, a logical control circuit 402, a sequencer 421, a register 422, a voltage generation circuit 423, an input/output pad group 411, a logical control pad group 412, and a power input terminal group 413.

The memory cell array 430 is a portion that stores data. The memory cell array 430 includes a plurality of memory cell transistors MT associated with a plurality of bit lines BL and a plurality of word lines WL. The specific configuration of the memory cell array 430 will be described below with reference to FIGS. 3 to 6.

The sense amplifier 440 is a circuit for adjusting a voltage applied to the bit line BL, or reading a voltage of the bit line BL and converting the voltage into data. At the time of data reading, the sense amplifier 440 acquires read data read from the memory cell transistor MT to the bit line BL, and transfers the acquired read data to the input/output circuit 401. At the time of data writing, the sense amplifier 440 transfers write data written via the bit line BL to the memory cell transistor MT. Operations of the sense amplifier 440 are controlled by the sequencer 421.

The row decoder 450 is a circuit configured as a switch group for applying voltages to the word lines WL, respectively. The row decoder 450 receives a block address and a row address from the register 422, selects a corresponding block on the basis of the corresponding block address, and selects a corresponding word line WL on the basis of the corresponding row address. The row decoder 450 switches opening and closing of the switch group such that a voltage from the voltage generation circuit 423 is applied to the selected word line WL. Operations of the row decoder 450 are controlled by the sequencer 421.

The input/output circuit 401 transmits/receives signals DQ<7:0>, and data strobe signals DQS and /DQS to/from the memory controller 1. The input/output circuit 401 transfers a command and an address within the signals DQ<7:0> to the register 422. The input/output circuit 401 transmits/receives write data and read data to/from the sense amplifier 440.

The logical control circuit 402 receives a chip enable signal /CE, a command latch enable signal CLE, an address latch enable signal ALE, a write enable signal /WE, read enable signals RE and /RE, and a write protect signal /WP from the memory controller 1. The logical control circuit 402 transfers a ready busy signal /RB to the memory controller 1 to notify the outside of the state of the semiconductor storage device 10.

The sequencer 421 controls the operation of each of units including the memory cell array 430 on the basis of control signals input to the input/output circuit 401 and the logical control circuit 402 from the memory controller 1.

The register 422 is a portion that temporarily stores a command or an address. The register 422 stores a command for an instruction of a write operation, a read operation, an erase operation, or the like. The corresponding command is input from the memory controller 1 to the input/output circuit 401, and then is transferred from the input/output circuit 401 to the register 422 and is stored.

The register 422 also stores an address corresponding to the command. The corresponding address is input from the memory controller 1 to the input/output circuit 401, and then is transferred from the input/output circuit 401 to the register 422 and is stored.

The register 422 also stores status information indicating the operation status of the semiconductor storage device 10. The status information is updated by the sequencer 421 each time according to the operation status of the memory cell array 430 or the like. The status information is output as a status signal from the input/output circuit 401 to the memory controller 1 according to a request from the memory controller 1.

The voltage generation circuit 423 is a portion of generating a voltage required for each of a write operation, a read operation, and an erase operation of data in the memory cell array 430. Such a voltage includes, for example, a voltage to be applied to each word line WL or a voltage to be applied to each bit line BL. The operation of the voltage generation circuit 423 is controlled by the sequencer 421.

The input/output pad group 411 is a portion in which a plurality of terminals (pads) for transmitting/receiving each signal between the memory controller 1 and the input/output circuit 401 is provided. A terminal corresponds to each of signals DQ<7:0>, and data strobe signals DQS and /DQS.

The logical control pad group 412 is a portion in which a plurality of terminals (pads) for transmitting/receiving each signal between the memory controller 1 and the logical control circuit 402 is provided. A terminal corresponds to each of a chip enable signal/CE, a command latch enable signal CLE, an address latch enable signal ALE, a write enable signal/WE, read enable signals RE and /RE, a write protect signal/WP, and a ready busy signal/RB.

The power input terminal group 413 is a portion where a plurality of terminals to which each voltage required for the operation of the semiconductor storage device 10 is to be applied is provided. The voltages to be applied to the terminals, respectively, include power-supply voltages Vcc, VccQ, Vpp, and a ground voltage Vss.

The power-supply voltage Vcc is a circuit power-supply voltage that is given as an operating power source from the outside, and is, for example, a voltage of about 3.3 V. The power-supply voltage VccQ is, for example, a voltage of 1.2 V. The power-supply voltage VccQ is a voltage used when a signal is transmitted/received between the memory controller 1 and the semiconductor storage device 10. The power-supply voltage Vpp is a power-supply voltage higher than the power-supply voltage Vcc, and is, for example, a voltage of 12 V.

Figure 3:
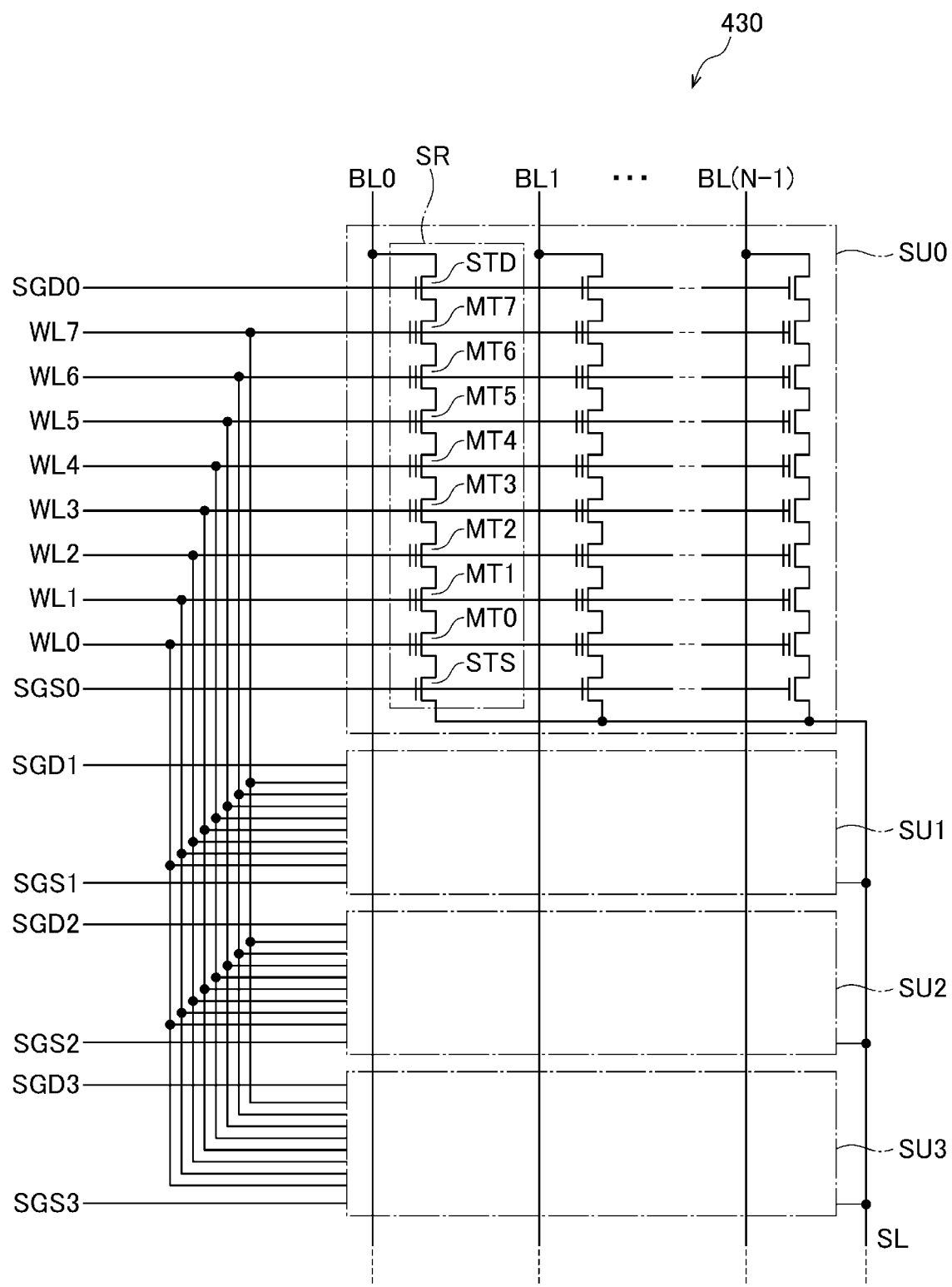
FIG. 3 is a circuit diagram illustrating an equivalent circuit of a semiconductor storage device according to a first embodiment.

The specific configuration of the memory cell array 430 will be described. FIG. 3 illustrates the configuration of the memory cell array 430 as an equivalent circuit diagram. As illustrated in FIG. 3, the memory cell array 430 includes a plurality of string units SU0 to SU3. Each of the string units SU0 to SU3 includes a plurality of NAND strings SR. Each NAND string SR includes, for example, eight memory cell transistors MT0 to MT7, and two select transistors STD and STS. The number of the memory cell transistors or select transistors in the NAND string SR may be different from that of the example in FIG. 1.

The plurality of string units SU0 to SU3 constitute one block as a whole, and a plurality of such blocks is provided in the memory cell array 430. In FIG. 3, only a single block is illustrated, and other blocks are omitted in the illustration.

In the following description, each of the string units SU0 to SU3 may also be referred to as a "string unit SU" without distinction. Similarly, each of the memory cell transistors MT0 to MT7 may also be referred to as a "memory cell transistor MT" without distinction.

Each string unit SU includes the same number of NAND strings SR as that of N provided bit lines BL0 to BL(N−1). N is a positive integer. The memory cell transistors MT0 to MT7 in the NAND string SR are arranged in series between a source of the select transistor STD and a drain of the select transistor STS. A drain of the select transistor STD is connected to any of the bit line BL0 and the like. A source of the select transistor STS is connected to a source line SL. In the following description, each of the bit lines BL1 to BL(N−1) may also be referred to as a "bit line BL" without distinction.

As described below, each memory cell transistor MT is configured as a transistor having a charge storage layer in a gate portion. The amount of charges stored in the corresponding charge storage layer corresponds to data stored in the memory cell transistor MT. The memory cell transistor MT may be a charge trap type using, for example, a silicon nitride film as the charge storage layer or may be a floating gate type using, for example, a silicon film as the charge storage layer.

All of the gates of the plurality of select transistors STD in the string unit SU0 are connected to a select gate line SGD0. The select gate line SGD0 is a line to which a voltage for switching opening/closing of each select transistor STD is applied. Similarly, for the string units SU1 to SU3 as well, select gate lines SGD1 to SGD3 for applying voltages to the select transistors STD are provided for each of the string units SU.

All of the gates of the plurality of select transistors STS in the string unit SU0 are connected to a select gate line SGS0. The select gate line SGS0 is a line to which a voltage for switching opening/closing of each select transistor STS is applied. Similarly, for the string units SU1 to SU3 as well, select gate lines SGS1 to SGS3 for applying voltages to the select transistors STS are provided for each of the string units SU. The string units SU0 to SU3 constituting one block may share a select gate line SGS, and the gates of all of the select transistors STS in the string units SU0 to SU3 may be connected to the common select gate line SGS.

The gates of the memory cell transistors MT0 to MT7 are connected to word lines WL0 to WL7, respectively. The word lines WL0 to WL7 are lines to which voltages are applied for the purpose of switching opening/closing of the memory cell transistors MT0 to MT7 or changing the amount of charges stored in each of charge storage layers of the memory cell transistors MT0 to MT7.

Writing and reading of data in the semiconductor storage device 10 are performed at once for each unit called a "page" in regard to the plurality of memory cell transistors MT connected to any of word lines WL in any of string units SU. Erasing of data in the semiconductor storage device 10 is performed at once for all of the memory cell transistors MT in a block. As a specific method of performing such writing, reading, and erasing of data, various known methods may be employed, and thus detailed descriptions thereof will be omitted.

Figure 4:
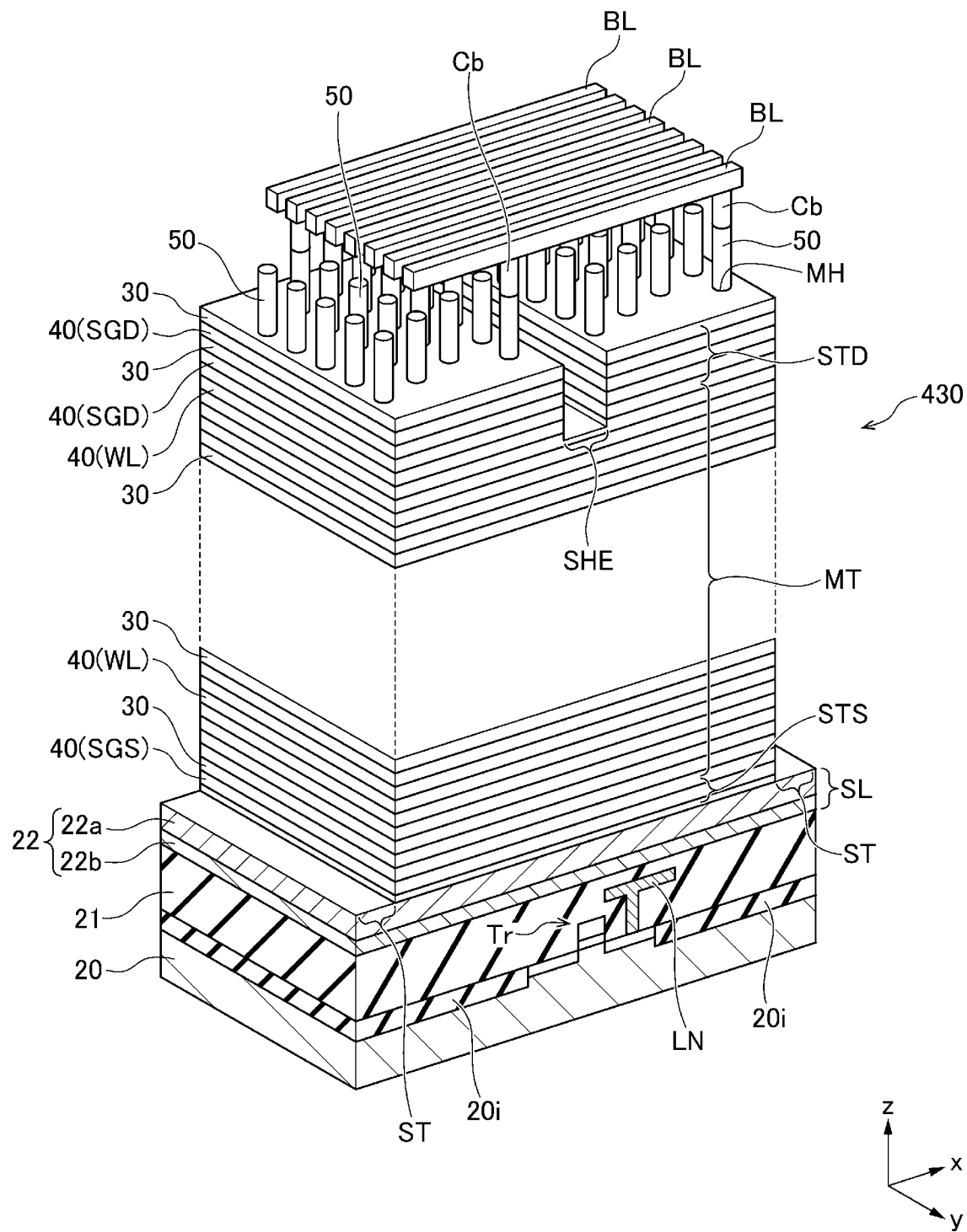
FIG. 4 schematically illustrates a perspective view of a part of a semiconductor storage device according to a first embodiment.

FIG. 4 illustrates a schematic perspective view of the configuration of the memory cell array 430 and a portion in the vicinity thereof in the semiconductor storage device 10. As illustrated in FIG. 4, the semiconductor storage device 10 includes a substrate 20, an insulator layer 21, a semiconductor layer 22, a plurality of insulator layers 30, and a plurality of conductor layers 40.

The substrate 20 is a plate-shaped member having a flat surface in the z direction of FIG. 4, and is, for example, a silicon wafer. The insulator layer 21, the semiconductor layer 22, the insulator layers 30, the conductor layers 40 and the like to be described below are films as a plurality of layers formed on the upper surface side of the substrate 20 by, for example, CVD film formation. For example, an element separation region 20i is provided on the surface of the substrate 20. The element separation region 20i is, for example, an insulating region containing silicon oxide, and its part is a portion partitioned into source and drain regions of a transistor Tr.

The insulator layer 21 is a layer formed of, for example, an insulating material such as silicon oxide. Peripheral circuits including, for example, the transistor Tr, wiring LN, or the like are formed on a side of the surface of the substrate 20. These peripheral circuits constitute the sense amplifier 440, the row decoder 450, or the like illustrated in FIG. 2. The insulator layer 21 covers all of these peripheral circuits.

The semiconductor layer 22 is a layer functioning as the source line SL in FIG. 3. The semiconductor layer 22 is formed of, for example, a silicon-containing material such as impurity-doped polycrystalline silicon. The semiconductor layer 22 is embedded in the insulator layer 21 in a portion below the memory cell array 430.

The semiconductor layer 22 may be entirely formed of a semiconductor material such as silicon, but may have a two-layer structure composed of a semiconductor layer 22a and a conductive layer 22b as in the example of FIG. 4. The semiconductor layer 22a is a layer formed of, for example, a semiconductor material such as silicon, and the conductive layer 22b is a layer formed of, for example, a metal material such as tungsten.

The insulator layers 30 and the conductor layers 40 are formed above the semiconductor layer 22, and are alternately arranged along the z direction of FIG. 4.

The conductor layer 40 is a layer formed of, for example, a tungsten-containing material, and having conductivity. The conductor layers 40 are used as the word lines WL0 to WL7, the select gate lines SGS1 and SGD1, and the like, respectively, in FIG. 3. The insulator layer 30 is disposed at a position between the conductor layers 40 adjacent to each other, and electrically insulates the two from each other. The insulator layer 30 is formed of, for example, a silicon oxide-containing material.

In the region where the insulator layers 30 and the conductor layers 40 are stacked along the z direction, a plurality of memory holes MH is formed through the insulator layers 30 and the conductor layers 40 along the z direction, and memory pillars 50 are formed inside the memory holes MH. Each memory pillar 50 is formed in a range from the insulator layer 30 on the uppermost side in the z direction to the semiconductor layer 22. Each memory pillar 50 corresponds to the NAND string SR illustrated in FIG. 3.

Figure 5:
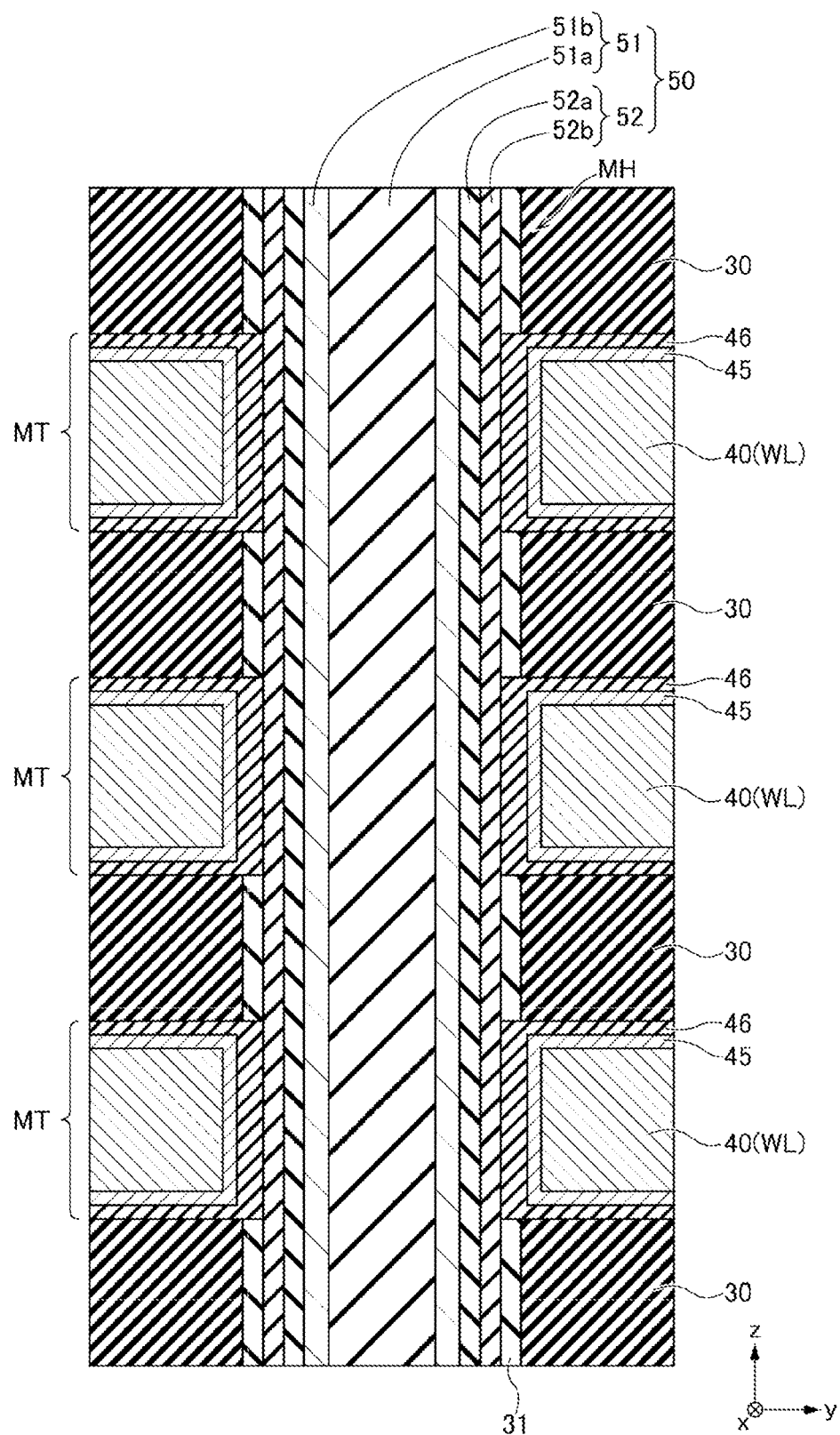
FIG. 5 schematically illustrates a cross-sectional view of a part of a semiconductor storage device according to a first embodiment.
Figure 6:
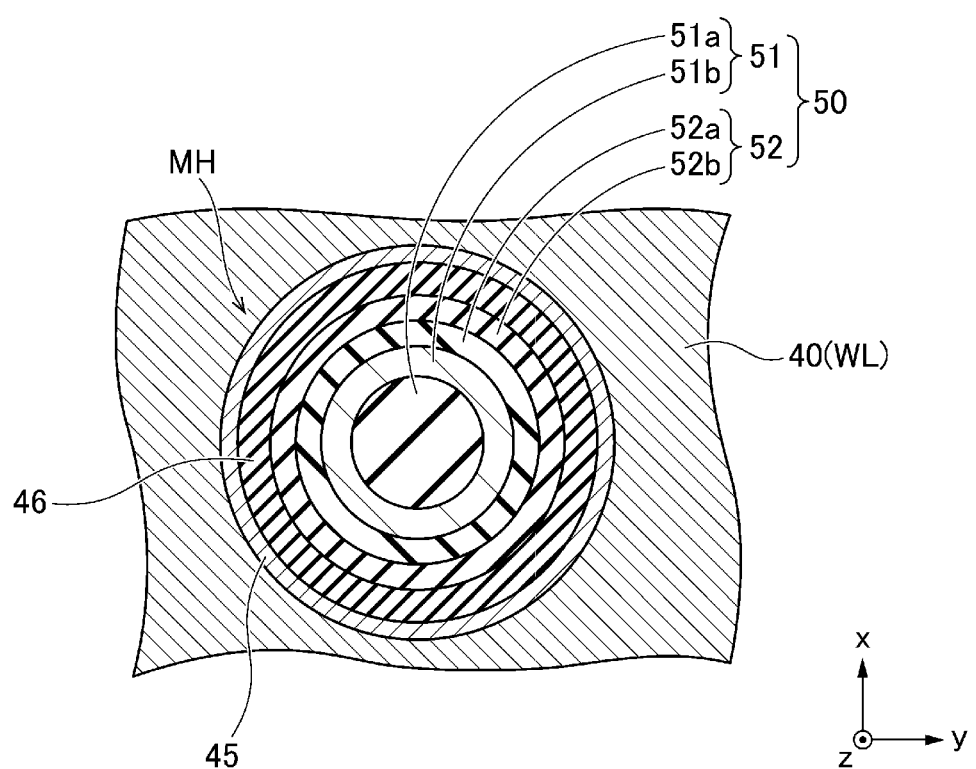
FIG. 6 schematically illustrates a cross-sectional view of a part of a semiconductor storage device according to a first embodiment.

FIG. 5 illustrates a cross-section of the memory pillar 50 when the memory pillar 50 is cut along a plane (y-z plane) passing through a central axis along the longitudinal direction thereof. FIG. 6 illustrates a cross-section of the memory pillar 50 when the memory pillar 50 is cut along a plane (x-y plane) perpendicular to the central axis thereof, and a plane passing through the conductor layer 40.

As illustrated in FIG. 6, the memory pillar 50 has a circular or elliptical cross-sectional shape. The memory pillar 50 has a body 51 and a stacked film 52.

The body 51 has a core portion 51a and a semiconductor portion 51b. The semiconductor portion 51b is a portion formed of, for example, a material made of amorphous silicon, in which a channel of the memory cell transistor MT or the like is formed. The core portion 51a is formed of, for example, an insulating material such as silicon oxide, and is provided inside the semiconductor portion 51b. In another configuration, the body 51 may be entirely composed of the semiconductor portion 51b, and the inside core portion 51a may not be provided.

The stacked film 52 is a multi-layered film covering the outer periphery of the body 51. The stacked film 52 has, for example, a tunnel insulating film 52a and a charge trapping film 52b. The tunnel insulating film 52a is a film formed at the innermost position. The tunnel insulating film 52a contains, for example, silicon oxide, or silicon oxide and silicon nitride. The tunnel insulating film 52a is a potential barrier between the body 51 and the charge trapping film 52b. For example, when an electron is injected from the body 51 to the charge trapping film 52b (write operation), and when a hole is injected from the body 51 to the charge trapping film 52b (erase operation), each of the electron and the hole passes through (tunneling) the potential barrier of the tunnel insulating film 52a.

The charge trapping film 52b is a film covering the outside of the tunnel insulating film 52a. The charge trapping film 52b contains, for example, silicon nitride, and has a trapping site that traps charges in the film. A portion of the charge trapping film 52b, which is interposed between the conductor layer 40 as the word line WL and the body 51, serves as the above-described charge storage layer, and constitutes a storage area of the memory cell transistor MT. The threshold voltage of the memory cell transistor MT changes according to the presence or absence of charges in the charge trapping film 52b, or the amount of the corresponding charges. Based on such a characteristic, the memory cell transistor MT stores information.

As illustrated in FIG. 5, the outer peripheral surface of the conductor layer 40 as the word line WL is covered with a barrier film 45 and a block insulating film 46. The barrier film 45 is a film for improving the adhesion between the conductor layer 40 and the block insulating film 46. As for the barrier film 45, a stacked structure film of titanium nitride and titanium is selected when, for example, the conductor layer 40 is tungsten.

The block insulating film 46 is a film for preventing back tunneling of charges from the conductor layer 40 to the stacked film 52 side. The block insulating film 46 is, for example, a silicon oxide film or a metal oxide film. One example of metal oxide is aluminum oxide.

A cover insulating film 31 is provided between the insulator layer 30 and the charge trapping film 52b. The cover insulating film 31 contains, for example, silicon oxide. The cover insulating film 31 is a film for protecting the charge trapping film 52b from being etched in a replacement step of replacing a sacrificial layer with the conductor layer 40. When the replacement step is not used in forming the conductor layer 40, the cover insulating film 31 may be omitted.

As described above, in the memory pillar 50, the inside of a portion to which each conductor layer 40 is connected functions as a transistor. That is, in each memory pillar 50, along the longitudinal direction thereof, a plurality of transistors is connected in series. Each conductor layer 40 is connected to the gate of a corresponding transistor via the stacked film 52. The semiconductor portion 51b present inside the transistor functions as a channel of the corresponding transistor.

Some of the transistors aligned in series as described above along the longitudinal direction of the memory pillar 50 function as the plurality of memory cell transistors MT in FIG. 3. Transistors formed on both sides of the plurality of memory cell transistors MT aligned in series function as the select transistors STD and STS in FIG. 3.

By referring back to FIG. 4, explanation is continued. As illustrated in FIG. 4, a plurality of bit lines BL is provided above the memory pillars 50. Each bit line BL is formed as linear wiring extending along the x direction in FIG. 4, and the bit lines BL are arranged along the y direction in FIG. 4. The upper end of the memory pillar 50 is connected to any of the bit lines BL via a contact Cb. Accordingly, the semiconductor portion 51b of each memory pillar 50 is electrically connected to the bit line BL.

The conductor layers 40 and the insulator layers 30 which are stacked are divided into a plurality of parts by slits ST. The slit ST is a linear groove that extends along the y direction in FIG. 4, and is formed to a depth at which, for example, the semiconductor layer 22 is reached.

The upper portion of the stacked conductor layers 40 and the insulator stacked layers 30 is divided by a slit SHE. The slit SHE is a shallow groove that extends along the y direction in FIG. 4. The slit SHT is formed to a depth at which only those provided as the select gate lines SGD among the conductor layers 40 are divided.

At the lower end of the memory pillar 50, the stacked film 52 is removed, and the semiconductor portion 51b is connected to the semiconductor layer 22. Accordingly, the semiconductor layer 22 functioning as the source line SL is electrically connected to the channel of corresponding transistors.

Figure 7:
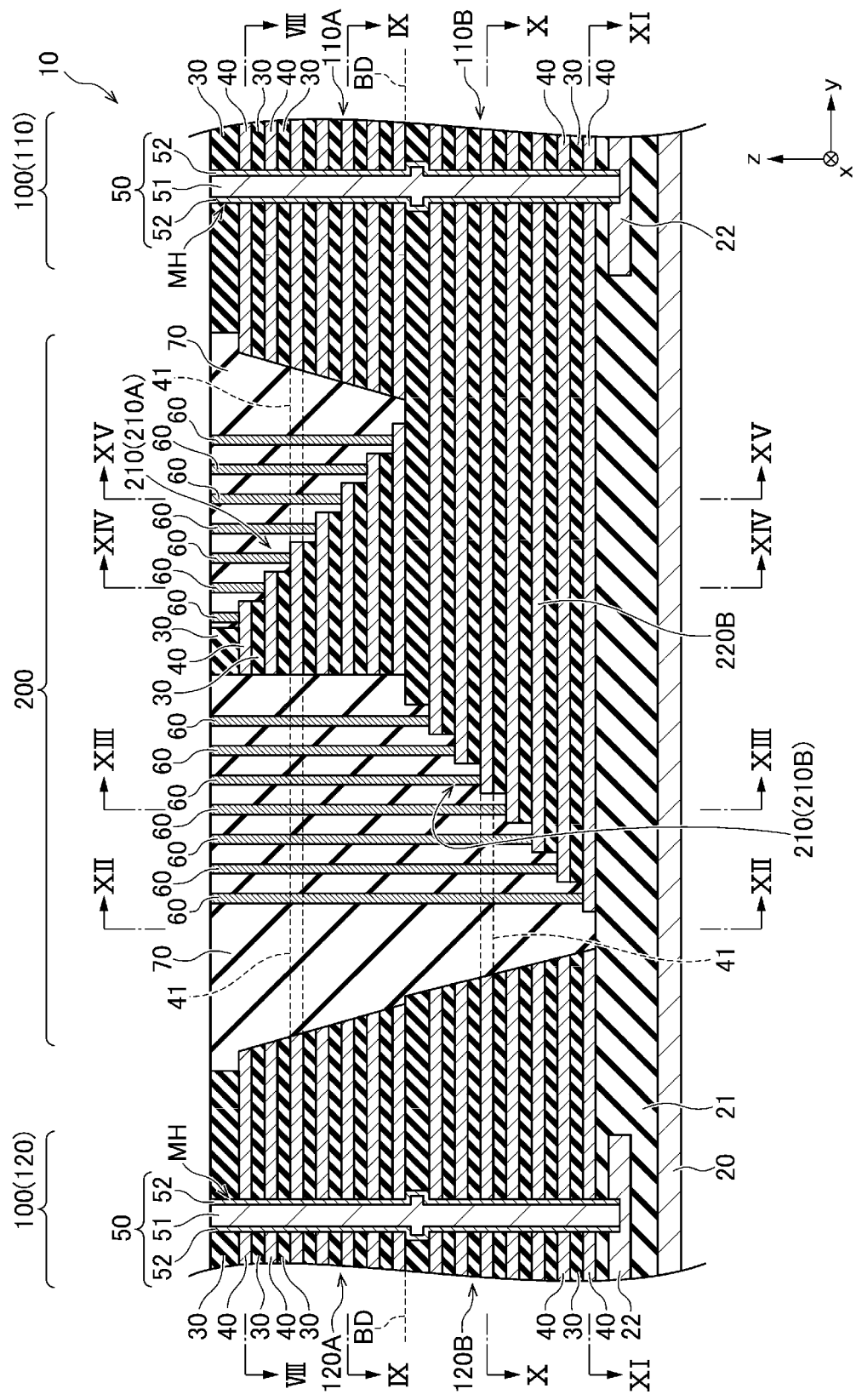
FIG. 7 schematically illustrates a cross-sectional view of a part of a semiconductor storage device according to a first embodiment.

A more specific configuration of the semiconductor storage device 10 will be described with reference to FIG. 7. FIG. 7 illustrates a schematic cross-sectional view of a range that includes a portion in which the above-described memory pillars 50 are formed (a portion denoted by the reference numeral "100"), and a portion in the vicinity thereof (a portion denoted by the reference numeral "200").

In FIG. 7, a direction perpendicular to the surface of the substrate 20, that is, a direction from the lower side to the upper side in FIG. 7, is set as the z direction, and the z axis is set along the corresponding direction. A direction perpendicular to the z direction, that is, a direction from the left side to the right in FIG. 7, is set as the y direction, and the y axis is set along the corresponding direction. A direction perpendicular to both the z direction and the y direction, that is, a direction from the front side of the paper to the back side in FIG. 7, is set as the x direction, and the x axis is set along the corresponding direction. The x axis, the y axis, and the z axis correspond to the x axis, the y axis, and the z axis illustrated in FIGS. 4 to 6, respectively. In the following, by properly using each direction or each axis set in this manner, the configuration of the semiconductor storage device 10 will be described.

In FIG. 7, the reference numeral "100" is given to a region in which the conductor layers 40 are stacked while covering the substrate 20, and the plurality of memory pillars 50 is formed through the conductor layers 40. Hereinafter, such a region is also referred to as "a stacked region 100." It can also be said that the stacked region 100 is a region where the plurality of memory cell transistors MT for storing data is formed.

In FIG. 7, the number of the stacked insulator layers 30 or the stacked conductor layers 40 may be different from the actual number of stacked layers. In FIG. 7, only a part of the memory pillars 50 formed in the stacked region 100 is illustrated.

As illustrated in FIG. 7, in a portion adjacent to the stacked region 100 along the y direction, each of the insulator layers 30 and each of the conductor layers 40 in the stacked region 100 are pulled from the stacked region 100, and these are formed in a stepwise form. In the corresponding region, since the conductor layers 40 are individually formed in the stepwise form, a part (a terrace portion) of each conductor layer 40 is exposed in the z direction without being blocked by another conductor layer 40. Each of the conductor layers 40 exposed in this manner is connected to the end of a contact 60 extending along the z direction. The contact 60 is, for example, a columnar member formed of a material having a conductor such as tungsten.

According to the above-described configuration, it is possible to individually perform voltage application or the like for the conductor layers 40 used as the word lines WL0 to WL7 and the select gate lines SGS1 and SGD1, through the contacts 60, respectively. Hereinafter, the portion where the conductor layers 40 are formed in the stepwise form as described above in order to enable the voltage application or the like for the conductor layers 40 in the stacked region 100 is also referred to as "a stepped portion 210" or a stair portion. The periphery of the stepped portion 210 or the contacts 60, where openings of the conductor layers 40 are formed, is filled with an insulator 70. The insulator 70 is, for example, silicon oxide.

As illustrated in FIG. 7, two stacked regions 100 are provided in the semiconductor storage device 10, and the stacked regions 100 are individually aligned along the y direction. Hereinafter, the stacked region 100 formed on the right side in FIG. 7 is also referred to as "a first stacked region 110." Hereinafter, the stacked region 100 formed on the left side in FIG. 7 is also referred to as "a second stacked region 120."

Hereinafter, a portion where the insulator layers 30 and the conductor layers 40 are stacked along the z direction, which is disposed between the first stacked region 110 and the second stacked region 120, is also referred to as "a connection region 200." The connection region 200 is a portion where the stepped portion 210 is formed, and corresponds to a "third stacked region" in the present embodiment. In the third stacked region, two openings of the conductor layers 40, where the insulator 70 is filled, are formed separately.

The number of the conductor layers 40 actually stacked in the stacked region 100 or the like is larger than the number illustrated in FIG. 7. Each memory pillar 50 is formed through all of these many conductor layers 40, and its actual shape is extremely elongated. In order to precisely form such a memory pillar 50, the stacking of the conductor layers 40 and the formation of the memory pillars 50 may not be performed once, but are often performed through a plurality of separate steps. In the present embodiment, the stacking of the conductor layers 40 and the formation of the memory pillars 50 are performed through two separate steps.

In FIG. 7, in the first stacked region 110, the stepped portion 210, and the second stacked region 120, portions formed by the first processing are denoted by the reference numerals "110B," "210B," and "120B," respectively. In the first stacked region 110, the stepped portion 210, and the second stacked region 120, portions formed by the second processing are denoted by the reference numerals "110A," "210A," and "120A," respectively. Hereinafter, the boundary between the portions formed by the first processing and the portions formed by the second processing is also referred to as a "boundary BD." In the connection region 200, a portion below the boundary BD corresponds to a "fourth stacked region" or a "first stacked subregion" in the present embodiment. In the connection region 200, a portion above the boundary BD corresponds to a "fifth stacked region" or a "second stacked subregion" in the present embodiment.

The portion denoted by the reference numeral "210A" is a portion above the boundary BD in the stepped portion 210. Hereinafter, the corresponding portion is also referred to as "an upper stepped portion 210A." The upper stepped portion 210A is formed such that the upper stepped portion 210A gets closer to the first stacked region 110 toward the lower side. That is, the upper stepped portion 210A is formed such that among the conductor layers 40 in the upper stepped portion 210A, one disposed on the lower side extends further than the conductor layer 40 disposed on the upper side toward the first stacked region 110 along the y direction. The upper stepped portion 210A corresponds to a "second stepped portion" or a "second stair portion" in the present embodiment.

The portion denoted by the reference numeral "210B" is a portion below the boundary BD in the stepped portion 210. Hereinafter, the corresponding portion is also referred to as "a lower stepped portion 210B." As illustrated in FIG. 7, the lower stepped portion 210B is disposed at a position closer to the second stacked region 120 than the upper stepped portion 210A in the y direction. The lower stepped portion 210B is formed such that the lower stepped portion 210B gets closer to the second stacked region 120 toward the lower side. That is, the lower stepped portion 210B is formed such that among the conductor layers 40 in the lower stepped portion 210B, one disposed on the lower side extends further than the conductor layer 40 disposed on the upper side toward the second stacked region 120 along the y direction. The lower stepped portion 210B corresponds to a "first stepped portion" or a "first stair portion" in the present embodiment.

In the connection region 200, a portion above the boundary BD, directly above the lower stepped portion 210B, becomes a portion through which the contact 60 provided on one of the conductor layers 40 in the lower stepped portion 210B passes. The corresponding portion is a part of the fifth stacked region, and corresponds to a "contact pass-through portion" in the present embodiment. It can also be said that the upper stepped portion 210A is a portion disposed between the contact pass-through portion and the first stacked region 110.

Figure 8:
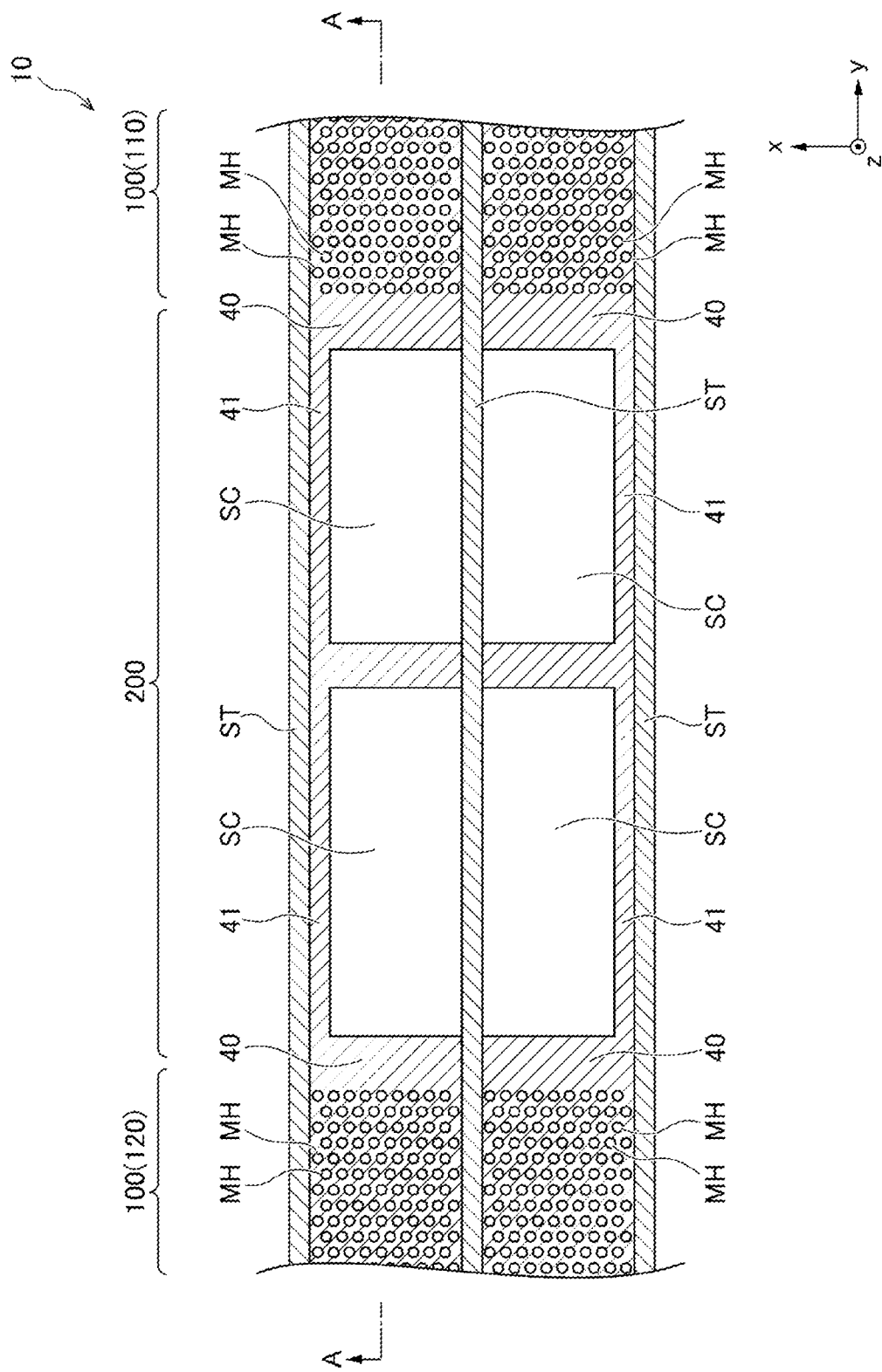
FIG. 8 schematically illustrates a cross-section taken along VIII-VIII of FIG. 7.

FIG. 8 schematically illustrates a cross-section taken along VIII-VIII of FIG. 7. In FIG. 8, a portion denoted by the reference symbol "ST" is the slit ST (see FIG. 4) that divides the stacked region 100 and the connection region 200. By the slit ST, the insulator layers 30 or the conductor layers 40 constituting the stacked region 100 and the like are divided along the x direction. An insulating spacer is formed on the inner surface of the slit ST, and the filling of a conductive material is performed through the corresponding insulating spacer. The insulating spacer is, for example, silicon oxide, and the conductive material is, for example, tungsten or polysilicon. According to such a configuration, the slit ST may be used as, for example, wiring for adjusting the potential of the semiconductor layer 22.

The slits ST are aligned along the x direction, but among them, only three slits ST are illustrated in FIG. 8.

In FIG. 8, the reference symbol "SC" is given to a rectangular opening formed in a portion of the conductor layer 40 corresponding to the stepped portion 210. Hereinafter, the corresponding opening is also referred to as an "opening SC." Inside the opening SC, the insulator 70 or the contacts 60 illustrated in FIG. 7 are present, but the illustration thereof is omitted in FIG. 8 in order to avoid complication. The cross-section illustrated in FIG. 7 corresponds to a cross-section when the semiconductor storage device 10 is cut along A-A in FIG. 8.

As illustrated in FIG. 8, the conductor layer 40 is not completely split by the opening SC. A gap is formed between the opening SC and the slit ST, and the conductor layer 40 extends in the portion of the corresponding gap along the y direction. Hereinafter, a portion of the conductor layer 40, between the opening SC and the slit ST, is also referred to as a "bridge portion 41." Among the conductor layers 40 stacked in the first stacked region 110, the conductor layers 40 stacked in the second stacked region 120, and the conductor layers 40 stacked in the connection region 200, those present at the same height positions are connected to each other via the bridge portions 41 and are electrically connected. That is, one of the conductor layers 40 in the upper stepped portion 210A does not extend to the conductor layer 40 in the first stacked region 110, but is electrically connected to one of the conductor layers 40 in the first stacked region 110 by the bridge portion 41. In FIG. 7, only a part of the plurality of bridge portions 41 is illustrated by a dotted line.

Figure 9:
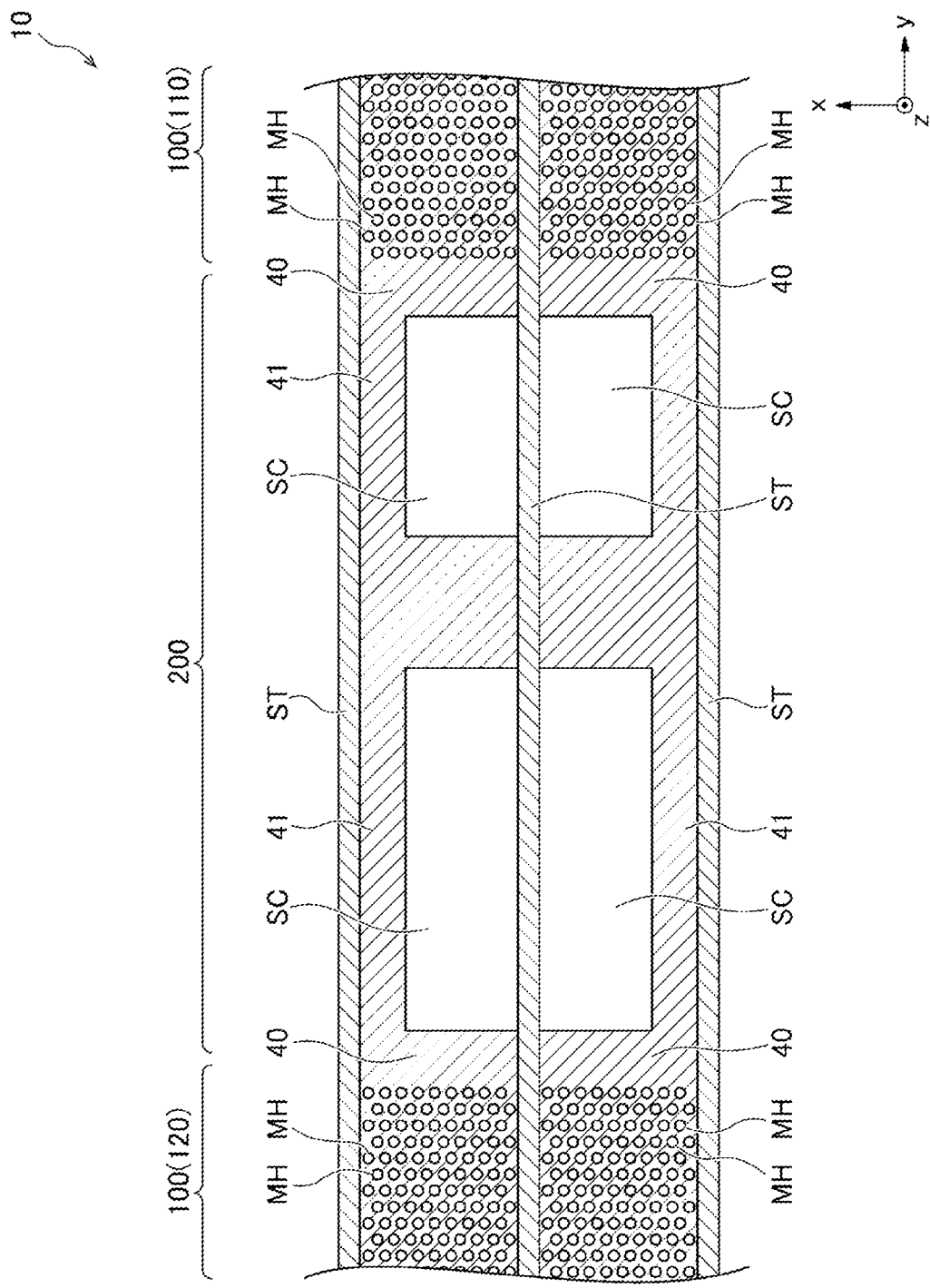
FIG. 9 schematically illustrates a cross-section taken along IX-IX of FIG. 7.
Figure 10:
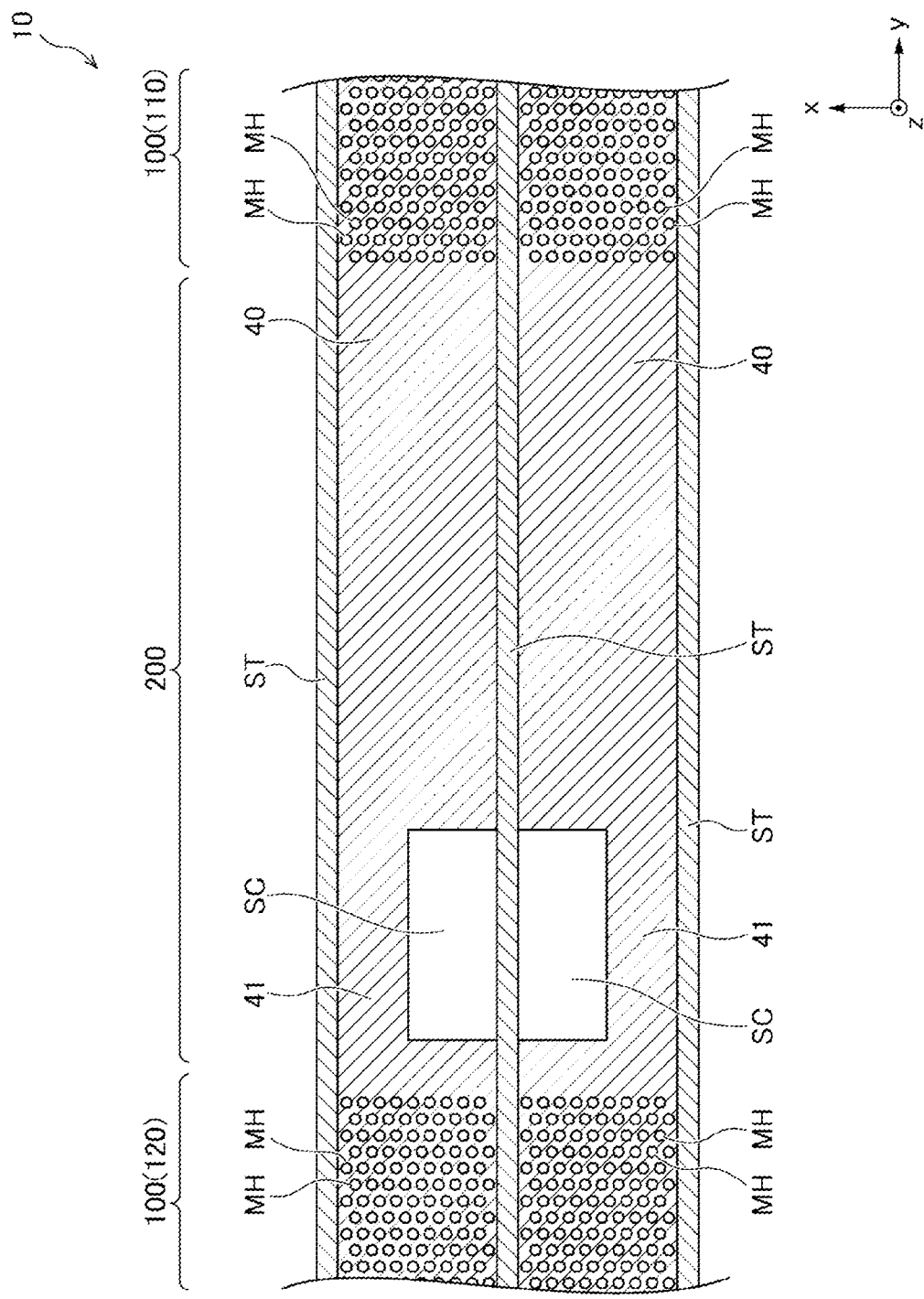
FIG. 10 schematically illustrates a cross-section taken along X-X of FIG. 7.
Figure 11:
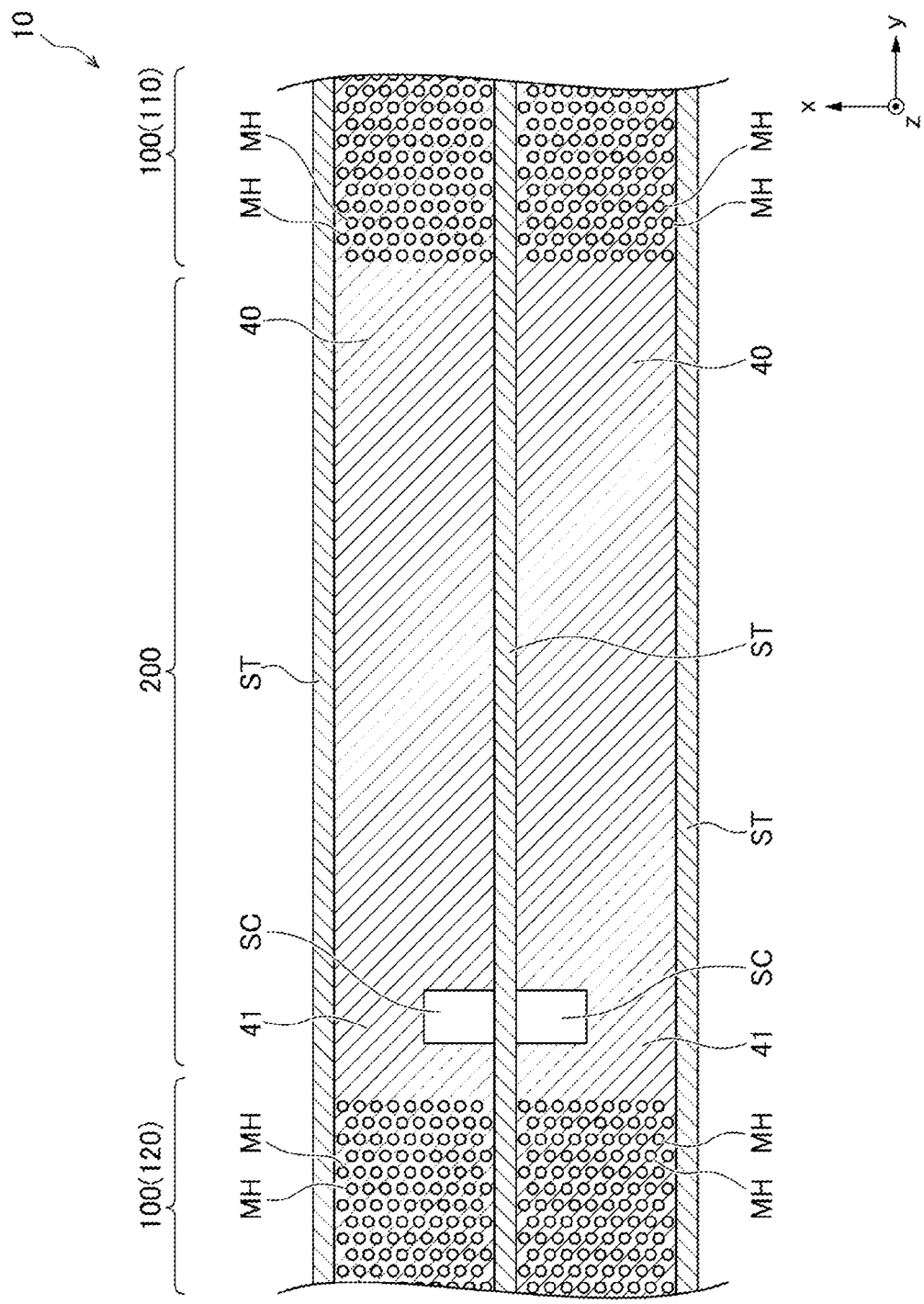
FIG. 11 schematically illustrates a cross-section taken along XI-XI of FIG. 7.

FIG. 9 schematically illustrates a cross-section taken along IX-IX of FIG. 7. FIG. 10 schematically illustrates a cross-section taken along X-X of FIG. 7. FIG. 11 schematically illustrates a cross-section taken along XI-XI of FIG. 7. As illustrated in each of these cross-sectional views, the shape of the opening SC formed in the conductor layer 40 varies depending on the z coordinate of the corresponding conductor layer 40. In the conductor layer 40 at any height position, the bridge portion 41 is formed between the opening SC and the slit ST. In the present embodiment, the bridge portion 41 is disposed between the couple of slits ST, at a position on one side of the opening SC in the x direction, that is, at a position on one side of the upper stepped portion 210A or the lower stepped portion 210B in the x direction.

The plurality of conductor layers 40 in the first stacked region 110 may include those not connected to the upper stepped portion 210A via the bridge portions 41. Likewise, the plurality of conductor layers 40 in the second stacked region 120 may include those not connected to the upper stepped portion 210A via the bridge portions 41.

Figure 12:
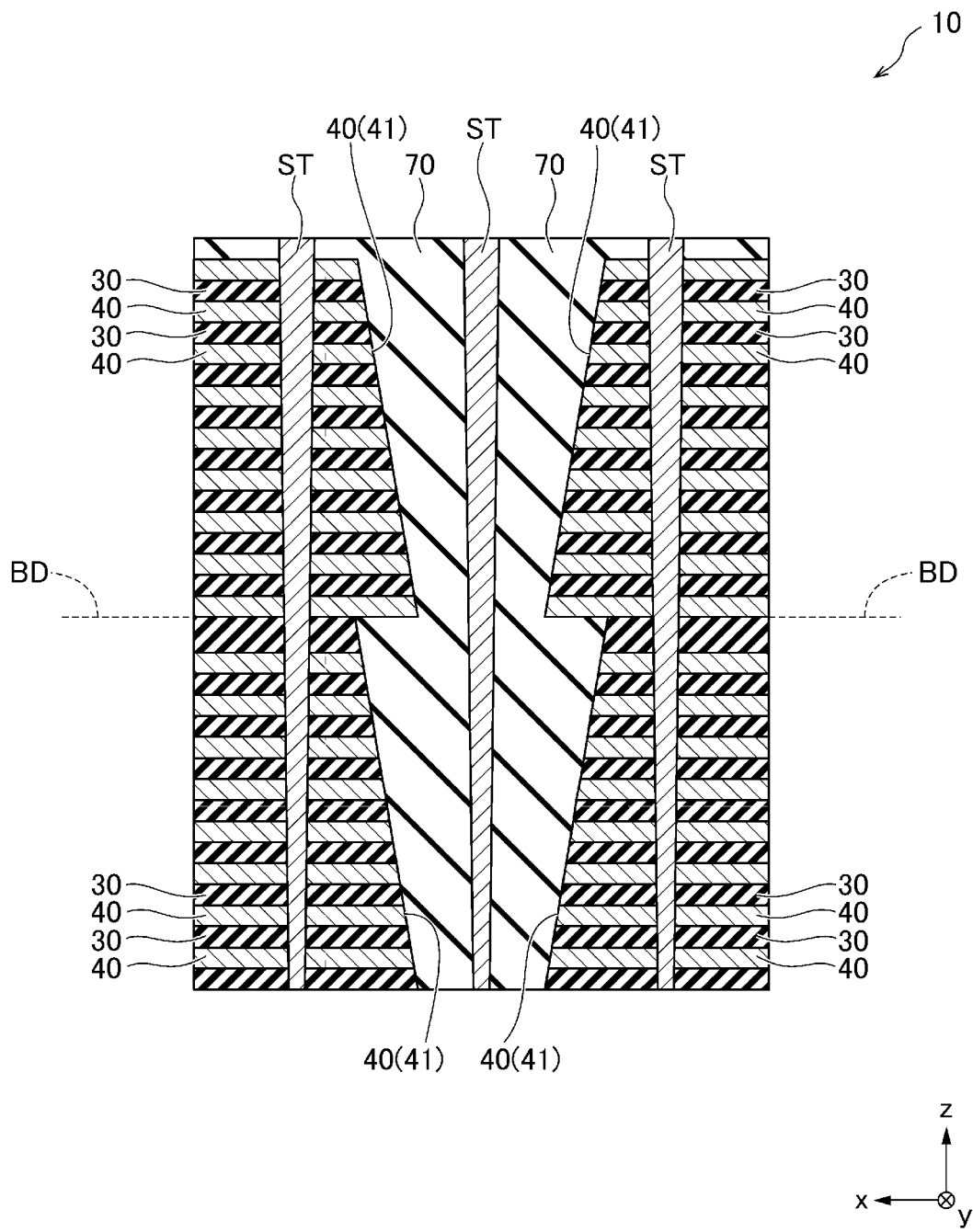
FIG. 12 schematically illustrates a cross-section taken along XII-XII of FIG. 7.
Figure 13:
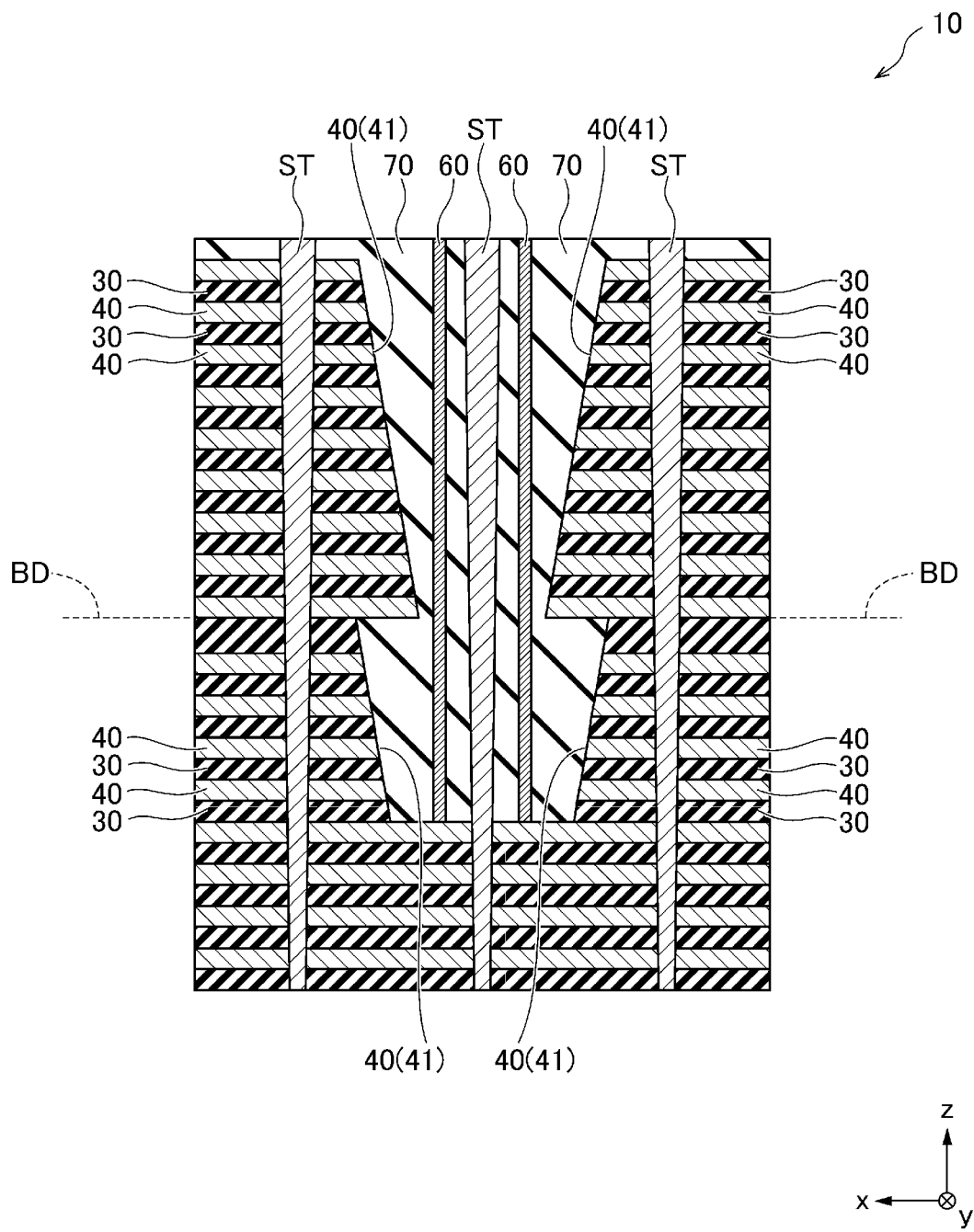
FIG. 13 schematically illustrates a cross-section taken along XIII-XIII of FIG. 7.
Figure 14:
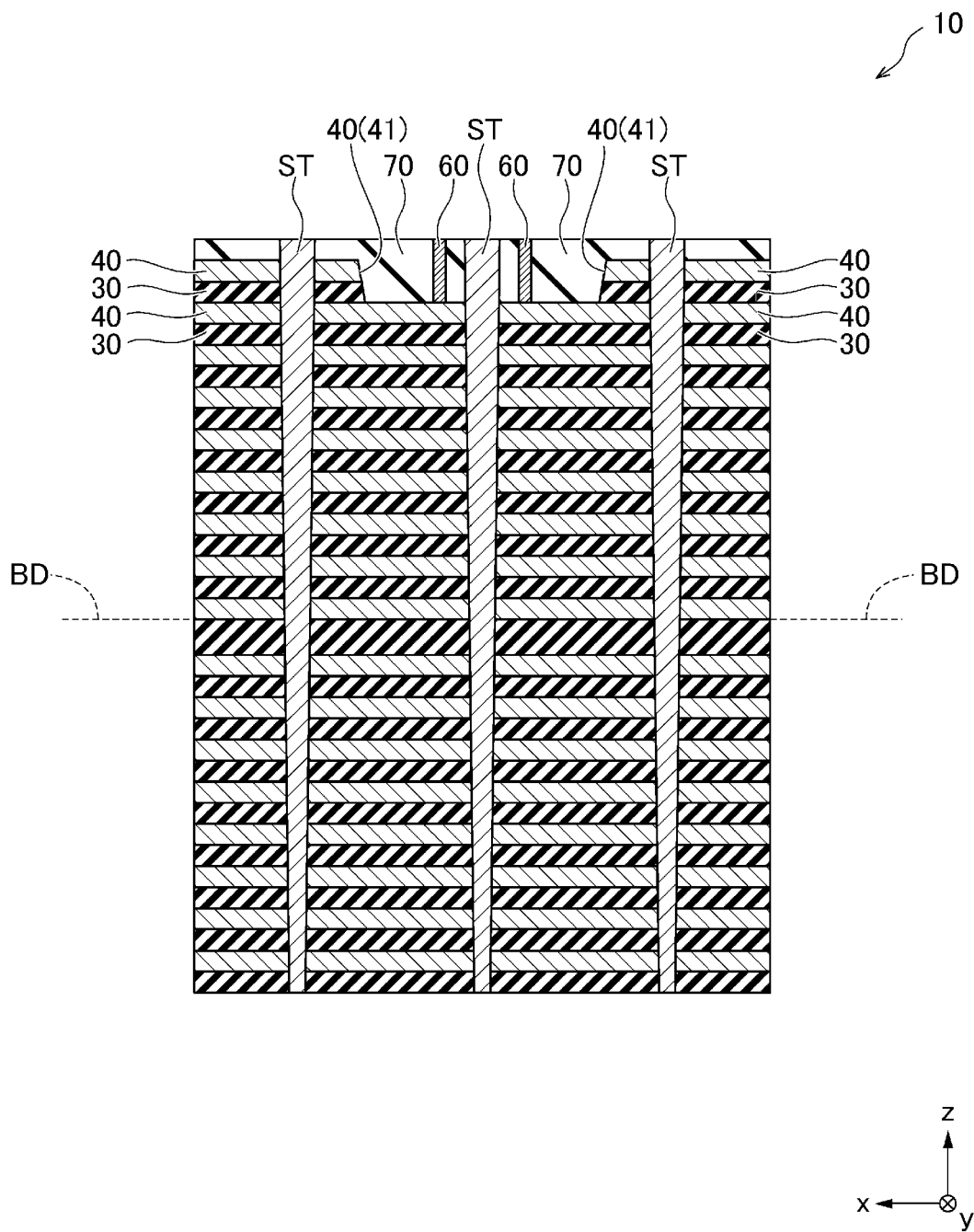
FIG. 14 schematically illustrates a cross-section taken along XIV-XIV of FIG. 7.
Figure 15:
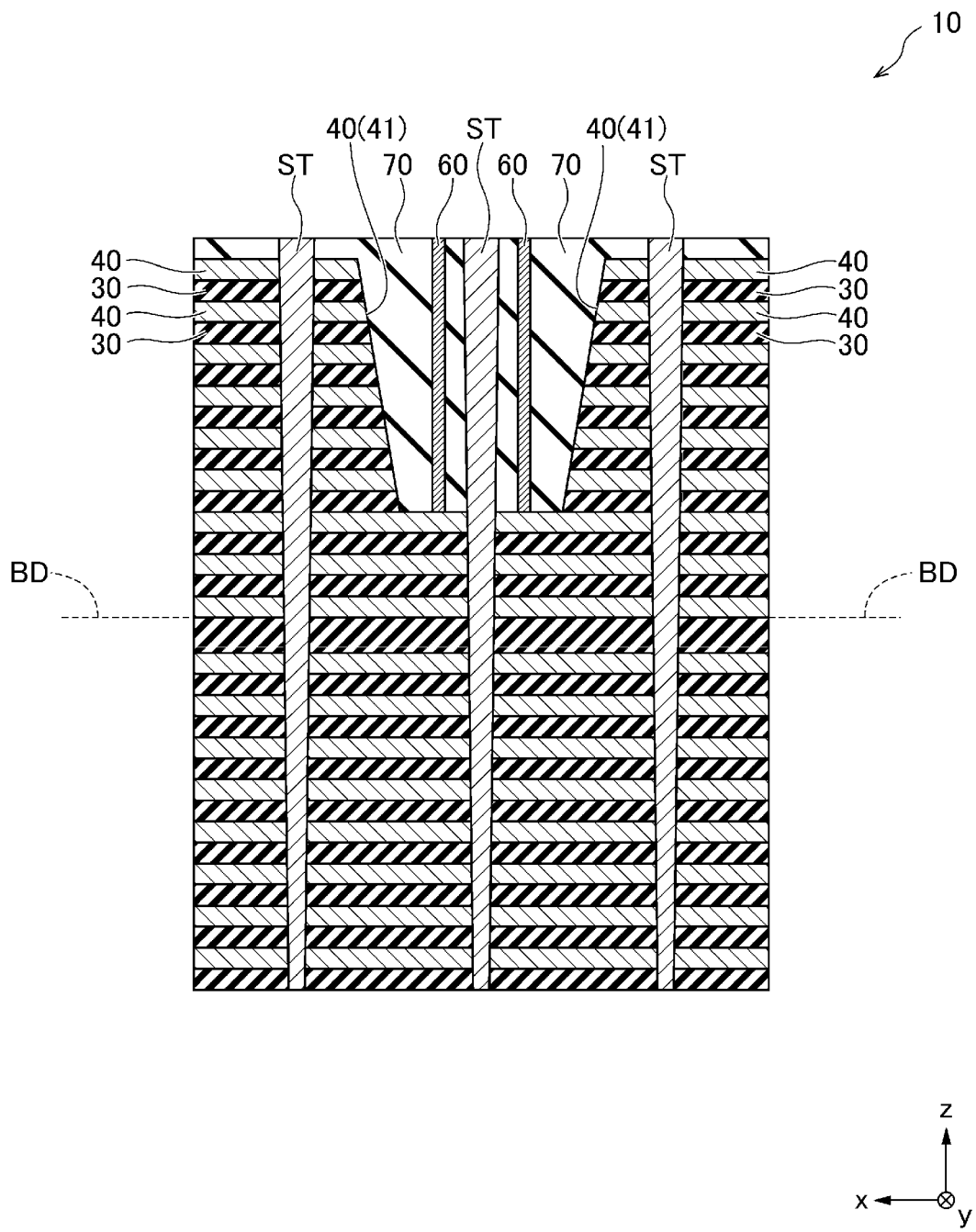
FIG. 15 schematically illustrates a cross-section taken along XV-XV of FIG. 7.

FIG. 12 schematically illustrates a cross-section taken along XII-XII in FIG. 7. FIG. 13 schematically illustrates a cross-section taken along XIII-XIII in FIG. 7. FIG. 14 schematically illustrates a cross-section taken along XIV-XIV in FIG. 7. FIG. 15 schematically illustrates a cross-section taken along XV-XV in FIG. 7. As illustrated in each of these cross-sectional views, at each of both sides above and below the boundary BD, width dimensions (dimensions in the x direction) of the bridge portions 41 are not uniform as a whole, and become smaller in the z direction. Such a shape is caused by the result of repetition of anisotropic etching and slimming of an etching mask when the stepped portion 210 is formed.

As is clear from FIG. 7, length dimensions of the bridge portions 41 (dimensions in the y direction) are also not uniform as a whole. Thus, electrical resistance values of the bridge portions 41 electrically connecting the stepped portion 210 to the first stacked region 110 or the stepped portion 210 to the second stacked region 120 are not uniform as a whole, and are different from each other according to the z coordinates of the bridge portions 41. In the present embodiment, in order to prevent the electrical resistance values of some of the bridge portions 41 from becoming too large, the shape or arrangement of the stepped portion 210 is configured.

Figure 16:
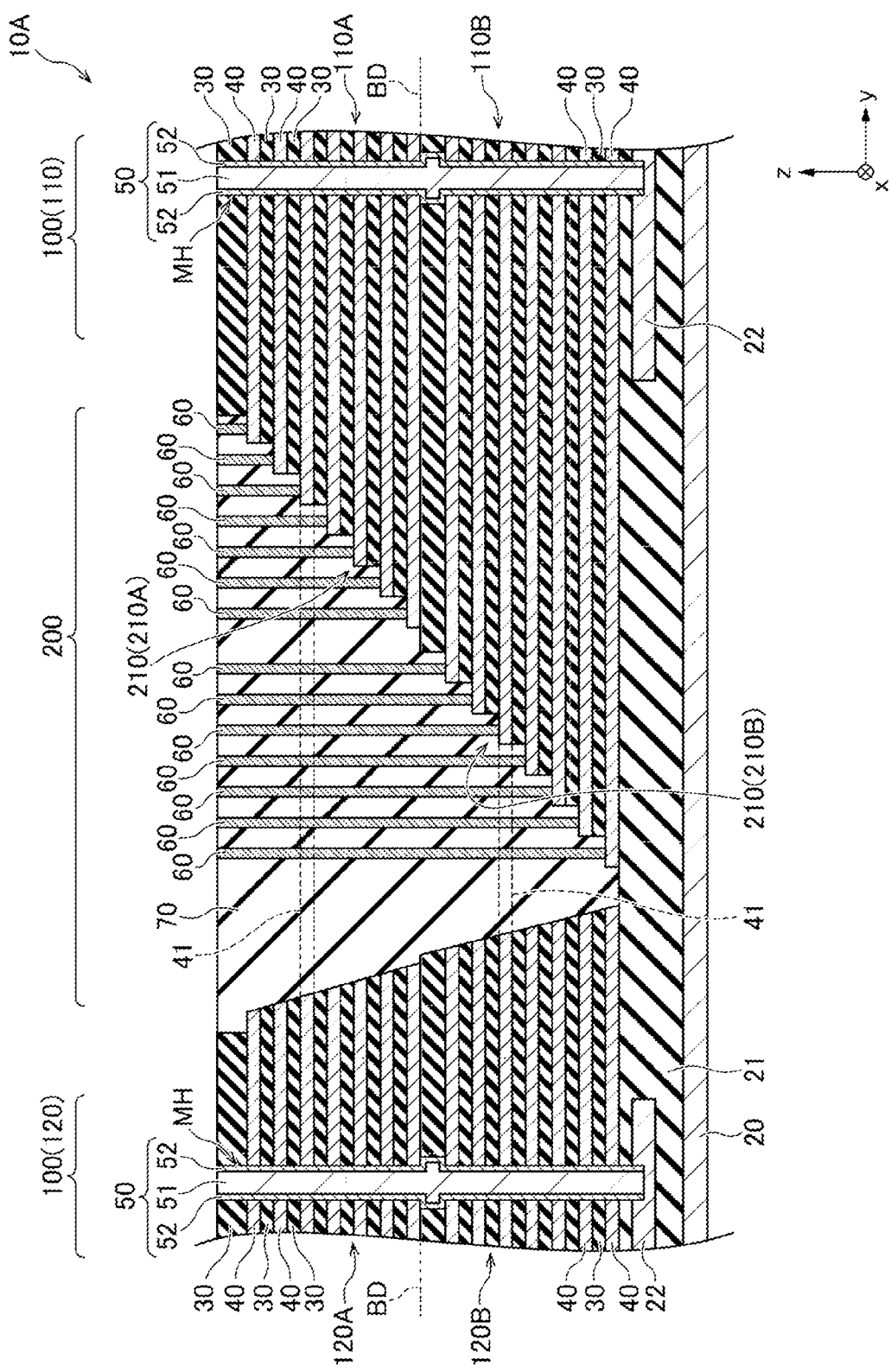
FIG. 16 schematically illustrates a cross-sectional view of a part of a semiconductor storage device according to a comparative example.

In order to explain the shape and arrangement, the configuration of a semiconductor storage device 10A according to a comparative example will be described. FIG. 16 illustrates the configuration of the semiconductor storage device 10A according to the comparative example by the same viewpoints and method as those in FIG. 7.

As illustrated in FIG. 16, the stepped portion 210 in the comparative example is formed such that the stepped portion 210 gets closer to the second stacked region 120 (to the left in FIG. 16) toward the lower side along the z direction. That is, the stepped portion 210 is formed such that among the conductor layers 40 in the stepped portion 210, each one disposed on the lower side extends further toward the second stacked region 120 along the y direction than the conductor layer 40 disposed on the upper side.

In the comparative example a bridge portion 41 such as in the first embodiment is also provided. However, due to the shape of the stepped portion 210, length dimensions (dimensions in the y direction) of the bridge portions 41 become larger and larger for the upper side (higher) layers.

Figure 17:
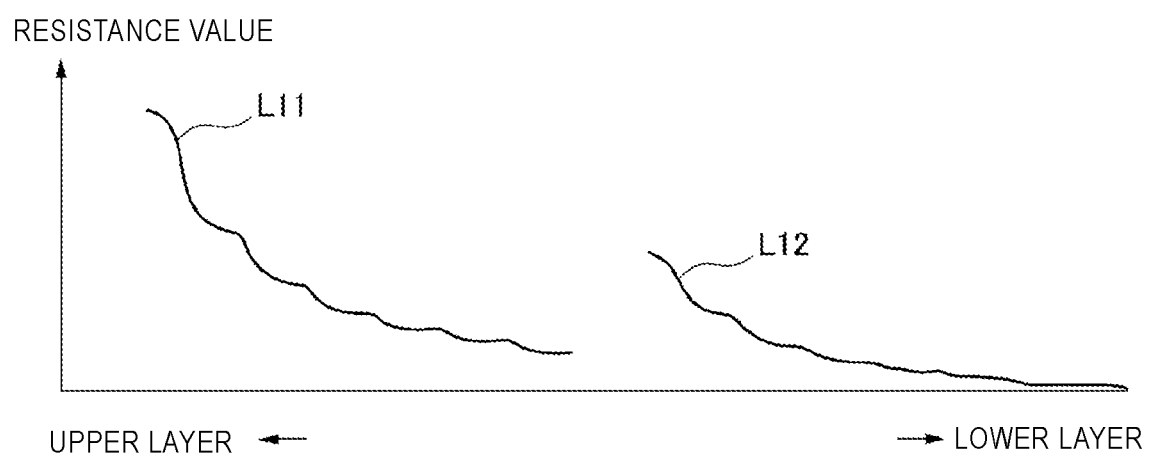
FIG. 17 is a graph illustrating electrical resistance values of bridge portions in the semiconductor storage device according to the comparative example.

FIG. 17 schematically illustrates a distribution of electrical resistance values of the bridge portions 41 of the semiconductor storage device 10A according to comparative example. The horizontal axis of the graph illustrated in FIG. 17 is a z coordinate (layer height) of the bridge portion 41, and the z coordinate becomes decreases toward the right.

The line L11 in FIG. 17 indicates a distribution of electrical resistance values of the bridge portions 41 in the portion on the z direction side (that is, the upper layer side) of the boundary BD. The line L12 indicates a distribution of electrical resistance values of the bridge portions 41 in the portion on the −z direction side (that is, the lower layer side) of the boundary BD.

On both the upper layer side and the lower layer side of the boundary BD, the electrical resistance values of the bridge portions 41 become smaller in the −z direction. This is because in the −z direction, the width dimensions of the bridge portions 41 become larger, and the length dimensions of the bridge portions 41 become shorter. In the bridge portion 41 at the left end of the line L11, that is, on the uppermost side in the z direction, the electrical resistance value is largest.

The stepped portion 210 and the first stacked region 110 are directly connected by each conductor layer 40 extending from the first stacked region 110 without the bridge portions 41. Thus, the electrical resistance value of a voltage supply path from the stepped portion 210 to the first stacked region 110 is negligibly small at any height position.

Whereas, the stepped portion 210 and the second stacked region 120 are connected by only the bridge portions 41 having relatively narrow widths. Thus, the electrical resistance values of voltage supply paths from the stepped portion 210 to the second stacked region 120 are larger than the electrical resistance values of the voltage supply paths to the first stacked region 110. In particular, the electrical resistance value of the voltage supply path at the position on the uppermost side in the z direction remarkably becomes large.

When a difference between the electrical resistance value of the voltage supply path from the stepped portion 210 to the first stacked region 110 and the electrical resistance value of the voltage supply path from the stepped portion 210 to the second stacked region 120 becomes too large, as will be described in detail below, the performance of the semiconductor storage device deteriorates.

Figure 18:
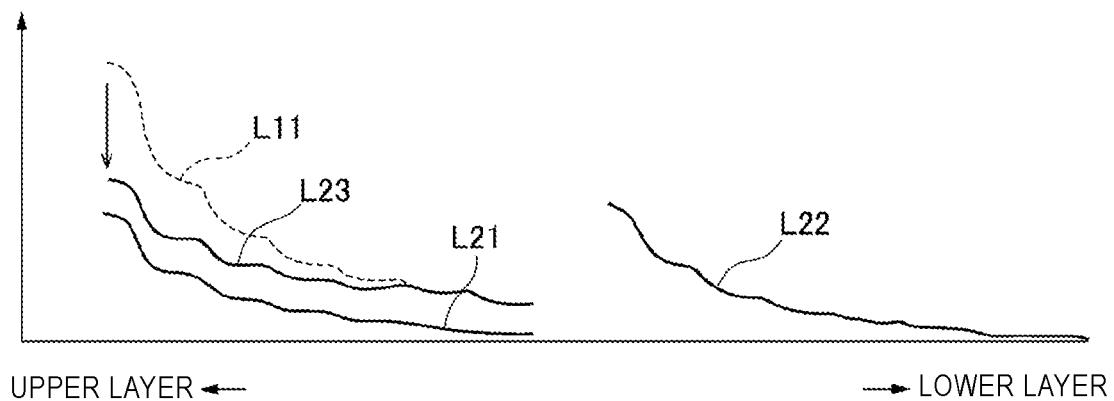
FIG. 18 is a graph illustrating electrical resistance values of bridge portions in a semiconductor storage device according to a first embodiment.

FIG. 18 schematically illustrates a distribution of electrical resistance values of the bridge portions 41 of the semiconductor storage device 10 according to the first embodiment, in the same manner as in FIG. 17.

The line L21 in FIG. 18 indicates a distribution of electrical resistance values of the plurality of bridge portions 41 provided between the upper stepped portion 210A and the first stacked region 110. The line L22 indicates a distribution of electrical resistance values of the plurality of bridge portions 41 provided between the lower stepped portion 210B and the second stacked region 120. The line L23 indicates a distribution of electrical resistance values of the plurality of bridge portions 41 provided between the upper stepped portion 210A and the second stacked region 120. In FIG. 18, the line L11 (for the comparative example) from FIG. 17 is again illustrated as a dotted line for reference.

The electrical resistance values of the bridge portions 41 extending from the upper stepped portion 210A, that is, the electrical resistance values indicated by the line L21 and the line L23, are significantly lower than the electrical resistance values in the comparative example indicated by the line L11. This is because the y-direction lengths of the bridge portions 41 connecting the upper stepped portion 210A to the second stacked region 120 are shorter than those in the comparative example. As indicated by the arrow in FIG. 18, in the bridge portions 41 disposed at the position on the uppermost side in the z direction, the reduction widths of the electrical resistance values relative to the comparative example are largest.

In the first embodiment, the bridge portions 41 connecting the upper stepped portion 210A to the first stacked region 110 are formed, and the electrical resistance values of the corresponding portions are larger than those in the comparative example. However, the electrical resistance values (the line L21) are slightly smaller than the electrical resistance values (the line L23) of the bridge portions 41 connecting the upper stepped portion 210A to the second stacked region 120, and thus there is no particular problem.

Figure 19A:
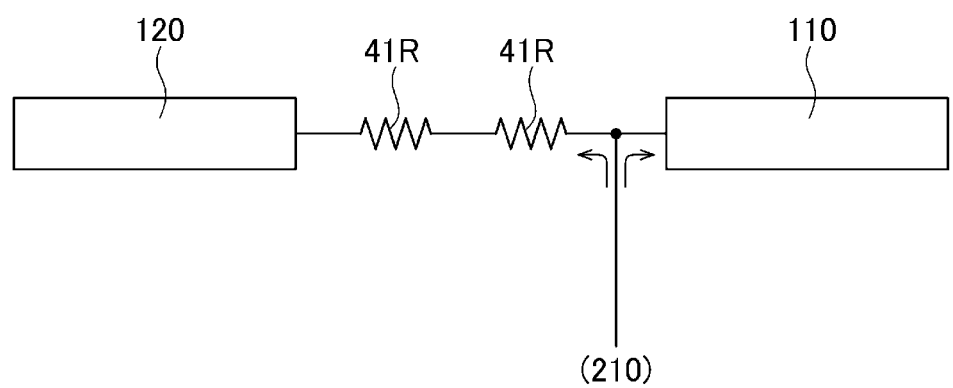
FIGS. 19A and 19B are equivalent circuit diagram of conductor layers to illustrate application of voltages to a first stacked region and a second stacked region.

FIG. 19A schematically illustrates paths through which a voltage can be applied to each of the first stacked region 110 and the second stacked region 120 in the semiconductor storage device 10A according to the comparative example. In FIG. 19A, the resistance denoted by the reference numeral "41R" indicates an electrical resistance of the bridge portion 41. As illustrated in FIG. 19A, in the comparative example, the electrical resistance value in the path from the stepped portion 210 to the first stacked region 110 is negligibly small. In the path from the stepped portion 210 to the second stacked region 120, since a relatively long bridge portion 41 is interposed, the electrical resistance value of the corresponding path becomes large. That is, in the semiconductor storage device 10A according to the comparative example, a large difference occurs between the electrical resistance value in the path from the stepped portion 210 to the first stacked region 110, and the electrical resistance value in the path from the stepped portion 210 to the second stacked region 120.

In such a configuration, when a voltage for writing data into the memory cell transistor MT is applied to the stepped portion 210, a delay occurs between the voltage applied to the gate of the memory cell transistor MT in the first stacked region 110 and the voltage applied to the gate of the memory cell transistor MT in the second stacked region 120 so that it becomes difficult to match both voltages with each other. As a result, until the threshold value of each memory cell transistor MT reaches an appropriate value, the number of times writing and verifying are executed is too large, and the time required for writing becomes long. As described above, in the configuration of the comparative example, the performance of the semiconductor storage device 10A deteriorates. Also, in the comparative example, since the electrical resistance value of the bridge portion 41 disposed at the position on the uppermost side in the z direction becomes very large, a problem occurs in that power consumption becomes high.

Figure 19B:
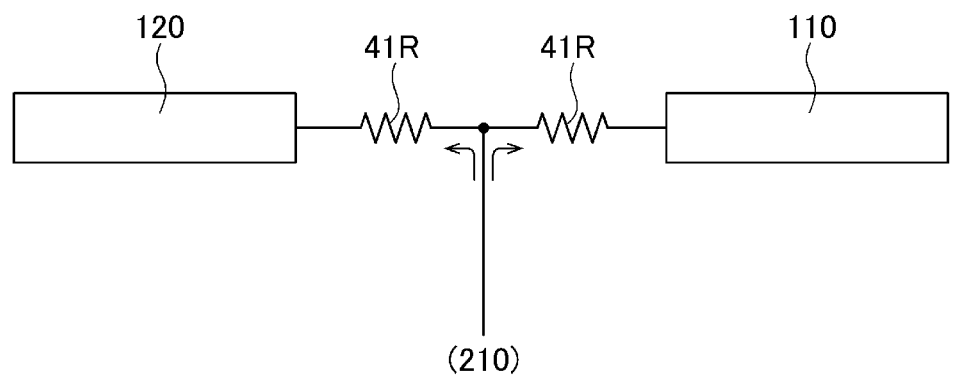

FIG. 19B schematically illustrates paths through which a voltage is applied to each of the first stacked region 110 and the second stacked region 120 in the semiconductor storage device 10 according to the present embodiment. As illustrated in FIG. 19B, in the present embodiment, there is a relatively small difference between the electrical resistance value in the path from the stepped portion 210 to the first stacked region 110, and the electrical resistance value in the path from the stepped portion 210 to the second stacked region 120. As a result, the above-described performance deterioration of the semiconductor storage device is less likely to occur.

As described above, the semiconductor storage device 10 according to the present embodiment includes the first stacked region 110, the second stacked region 120, and the connection region 200. All of these are regions which become the plurality of conductor layers 40 stacked along the z direction.

The z direction in which the conductor layers 40 are individually stacked corresponds to a "first direction" in the present embodiment. The first direction may be referred to as a thickness direction. The y direction in which the first stacked region 110 and the second stacked region 120 are lined up is a direction intersecting the z direction as the first direction, and corresponds to a "second direction" in the present embodiment. The connection region 200 is disposed at a position between the first stacked region 110 and the second stacked region 120 in the y direction.

The connection region 200 includes the lower stepped portion 210B and the upper stepped portion 210A. The lower stepped portion 210B is disposed at the position on the lower side in the z direction, and at the position on the second stacked region 120 side in the y direction. The upper stepped portion 210A is disposed at the position above the lower stepped portion 210B in the z direction, and at the position closer to the first stacked region 110 than the lower stepped portion 210B in the y direction.

The upper stepped portion 210A is formed such that one disposed on the lower side among the conductor layers 40 in the upper stepped portion 210A extends further than one disposed on the upper side among the conductor layers 40 in the upper stepped portion 210A toward the first stacked region 110 along the y direction.

According to such a configuration, in the present embodiment, especially, the electrical resistance value of the bridge portion 41 disposed at the position on the uppermost side in the z direction is reduced as compared to that in the related art, and accordingly, the performance of the semiconductor storage device 10 is improved.

In the connection region 200 above the boundary BD, that is, in the fifth stacked region, the bridge portion 41 that electrically connects one of the conductor layers 40 in the upper stepped portion 210A, to one of the conductor layers 40 in the first stacked region 110 extends in the y direction. A portion adjacent to the upper stepped portion 210A in the x direction, in which the bridge portions 41 are stacked in the z direction, corresponds to a "second bridge portion" in the present embodiment. It can be said that each bridge portion 41 in this portion is "one of the conductor layers 40 in the second bridge portion." Together with the upper stepped portion 210A, the second bridge portion is provided in the fifth stacked region. The second bridge portion in the present embodiment is disposed between the couple of slits ST, at a position on one side of the upper stepped portion 210A in the x direction. The x direction is a direction intersecting both the z direction and the y direction, and corresponds to a "third direction" in the present embodiment. By providing such a second bridge portion, it is possible to secure an electrical connection between the upper stepped portion 210A and the first stacked region 110.

In the connection region 200 below the boundary BD, that is, in the fourth stacked region, the bridge portion 41 that electrically connects one of the conductor layers 40 in the lower stepped portion 210B, to one of the conductor layers 40 in the second stacked region 120 extends in the y direction. That is, one of the conductor layers 40 in the lower stepped portion 210B does not extend to the conductor layer 40 in the second stacked region 120, and is electrically connected to one of the conductor layers 40 in the second stacked region 120 by the bridge portion 41. A portion adjacent to the lower stepped portion 210B in the x direction, in which the bridge portions 41 are stacked in the z direction, corresponds to a "first bridge portion" in the present embodiment. It can be said that each bridge portion 41 in this portion is "one of the conductor layers 40 in the first bridge portion." Together with the lower stepped portion 210B, the first bridge portion is provided in the fourth stacked region. The first bridge portion is disposed between the couple of slits ST, at a position on one side of the lower stepped portion 210B in the x direction. By providing such a first bridge portion, it is possible to secure an electrical connection between the lower stepped portion 210B and the second stacked region 120.

Hereinafter, in order to describe a method of forming the contacts 60 in the present embodiment, a method of manufacturing the semiconductor storage device 10 will be briefly described with reference to FIGS. 20A to 20E.

Figure 20A:
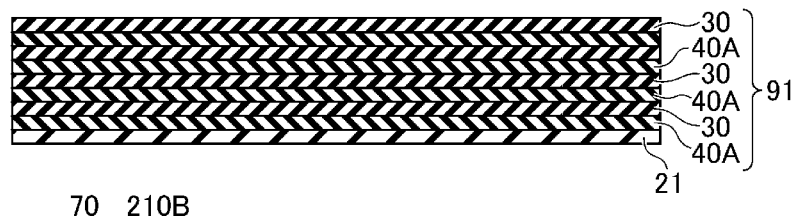
FIGS. 20A to 20E illustrate a method of manufacturing a semiconductor storage device according to a first embodiment.

<Lower Side Stacking Step> First, as illustrated in FIG. 20A, a stacked body 91 is formed on the upper surface of the insulator layer 21 provided on the substrate 20. The stacked body 91 is a layer in which the insulator layers 30 and sacrificial layers 40A are alternately stacked along the z direction. The sacrificial layers 40A are layers that are replaced by the conductor layers 40 in a subsequent step. For such a sacrificial layer 40A, for example, silicon nitride is used. The stacked body 91 is a portion on the −z direction side of the boundary BD in FIG. 7, that is, a portion that will later become the first stacked region 110B, the second stacked region 120B, the lower stepped portion 210B and the like.

Figure 20B:
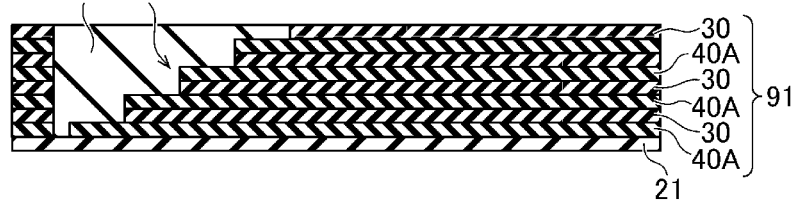

<Lower Staircase Forming Step> Next, anisotropic etching and slimming of an etching mask are repeated to form the lower stepped portion 210B in the stacked body 91. The periphery of the lower stepped portion 210B is filled with the insulator 70. FIG. 20B schematically illustrates the state where the lower stepped portion 210B is formed in this manner.

After the lower stepped portion 210B is formed, a plurality of memory holes MH is formed through the stacked body 91, and a sacrificial material is filled therein. A hole for forming a columnar body that maintains the strength of the stacked body 91 at the time of subsequent replacement is also formed similarly to the memory hole MH, and a sacrificial material is filled therein. In FIGS. 20A to 20E, these memory holes MH and the like are omitted in the illustration.

Figure 20C:
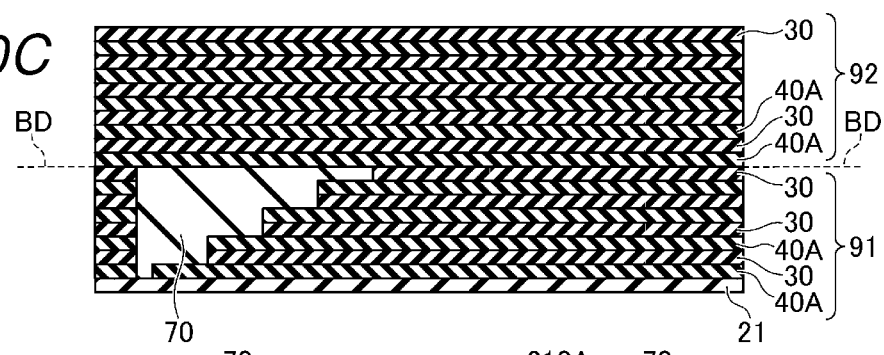

<Upper Side Stacking Step> Subsequently, as illustrated in FIG. 20C, a stacked body 92 is formed on the upper surface of the stacked body 91 in which the lower stepped portion 210B is formed. The stacked body 92 is a layer in which the insulator layers 30 and sacrificial layers 40A are alternately stacked similarly to the stacked body 91. The stacked body 92 is a portion on the z direction side of the boundary BD in FIG. 7, that is, a portion that will later become the first stacked region 110A, the second stacked region 120A, the upper stepped portion 210A and the like.

Figure 20D:
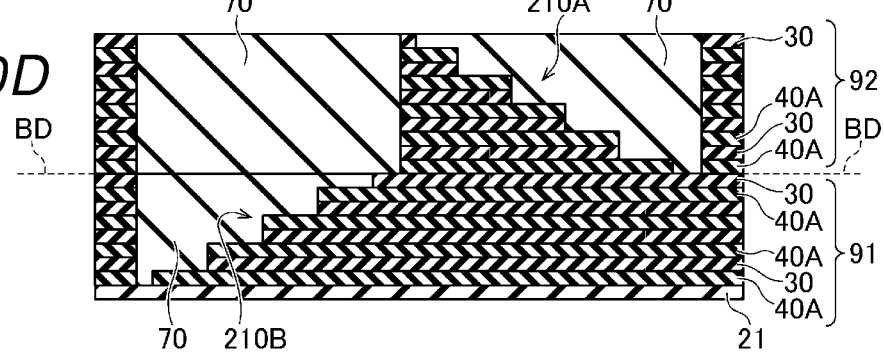

<Upper Staircase Forming Step> Next, anisotropic etching and slimming of an etching mask are repeated to form the upper stepped portion 210A in the stacked body 92. The periphery of the upper stepped portion 210A is filled with the insulator 70. In the stacked body 92, an opening is formed at a position directly above the lower stepped portion 210B, and the corresponding opening is also filled with the insulator 70. FIG. 20D schematically illustrates the state where the upper stepped portion 210A is formed in this manner.

After the upper stepped portion 210A is formed, memory holes are formed through the stacked body 92 at positions directly above the memory holes MH formed in the stacked body 91. Subsequently, after the sacrificial material filling in the memory holes MH of the stacked body 91 is removed, the memory pillars 50 are formed within the memory holes MH. The columnar body for maintaining the strength of the stacked body 91 at the time of subsequent replacement is also formed similarly to the memory pillar 50. In FIGS. 20A to 20E, these memory pillars 50 and the like are omitted in the illustration.

After the upper staircase forming step is completed, the slits ST (see FIG. 8 or the like) are formed in the stacked bodies 91 and 92. Next, the sacrificial layers 40A in the stacked bodies 91 and 92 are replaced by the conductor layers 40 through wet etching or the like via the corresponding slits ST. When the replacement is completed, the inside of the slit ST is filled with, for example, a conductive material such as tungsten or polysilicon through, for example, an insulating spacer made of silicon oxide.

Figure 20E:
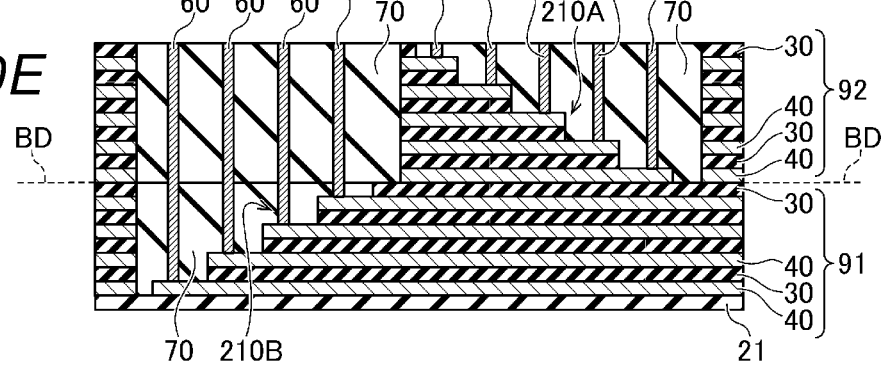

<Contact Forming Step> Next, in the stacked body 92, a plurality of openings is formed through the insulator 70 along the z direction by etching at each of the position directly above the upper stepped portion 210A, and the position directly above the lower stepped portion 210B. The openings formed at the position directly above the lower stepped portion 210B are formed through both the insulator 70 in the stacked body 92, and the insulator 70 in the stacked body 91. Then, each of the openings is filled with, for example, a conductor such as tungsten to form the plurality of contacts 60. FIG. 20E schematically illustrates a state where the formation of the contacts 60 is completed.

According to the above-described method, in the present embodiment as well, the contacts 60 connected to terrace portions of each of the upper stepped portion 210A and the lower stepped portion 210B may be formed in the same manner as in the related art.

A modification example of the first embodiment will be described. In this modification example, the shape of the opening SC formed in each conductor layer 40 is different from that in the first embodiment.

Figure 21:
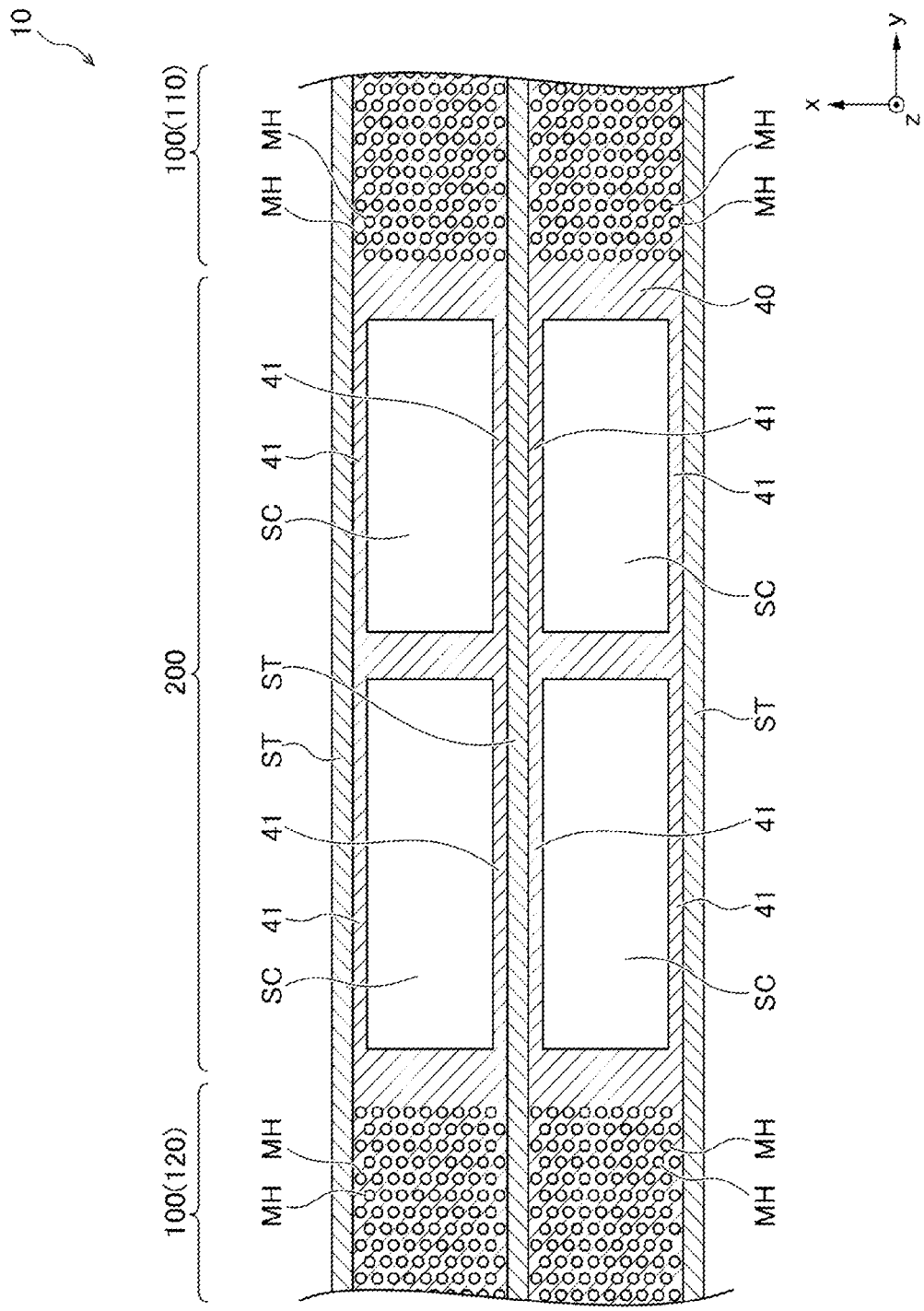
FIG. 21 schematically illustrates a cross-sectional view of a part of a semiconductor storage device according to a modification example.
Figure 22:
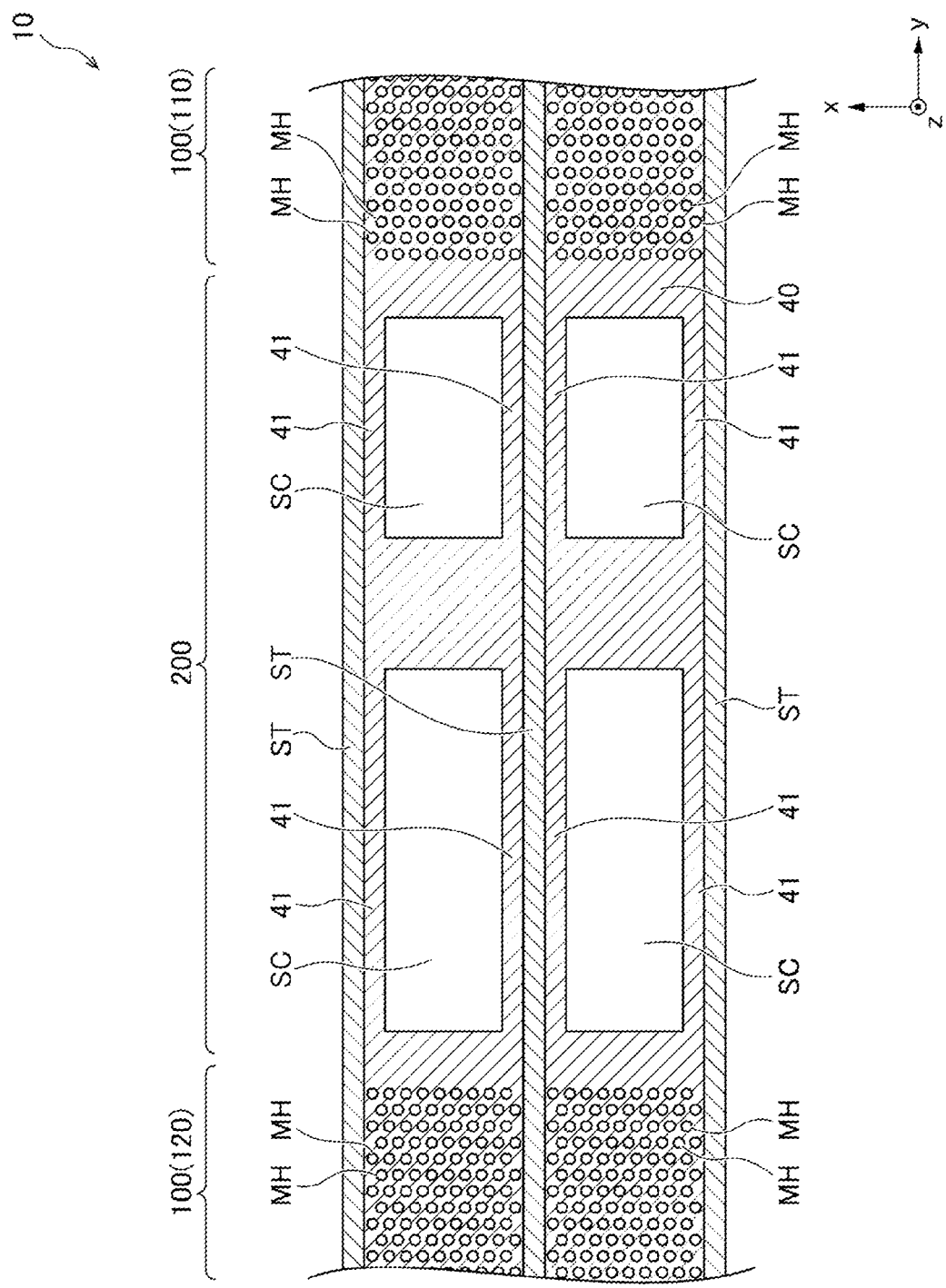
FIG. 22 schematically illustrates another cross-sectional view of the part of a semiconductor storage device according to a modification example.
Figure 23:
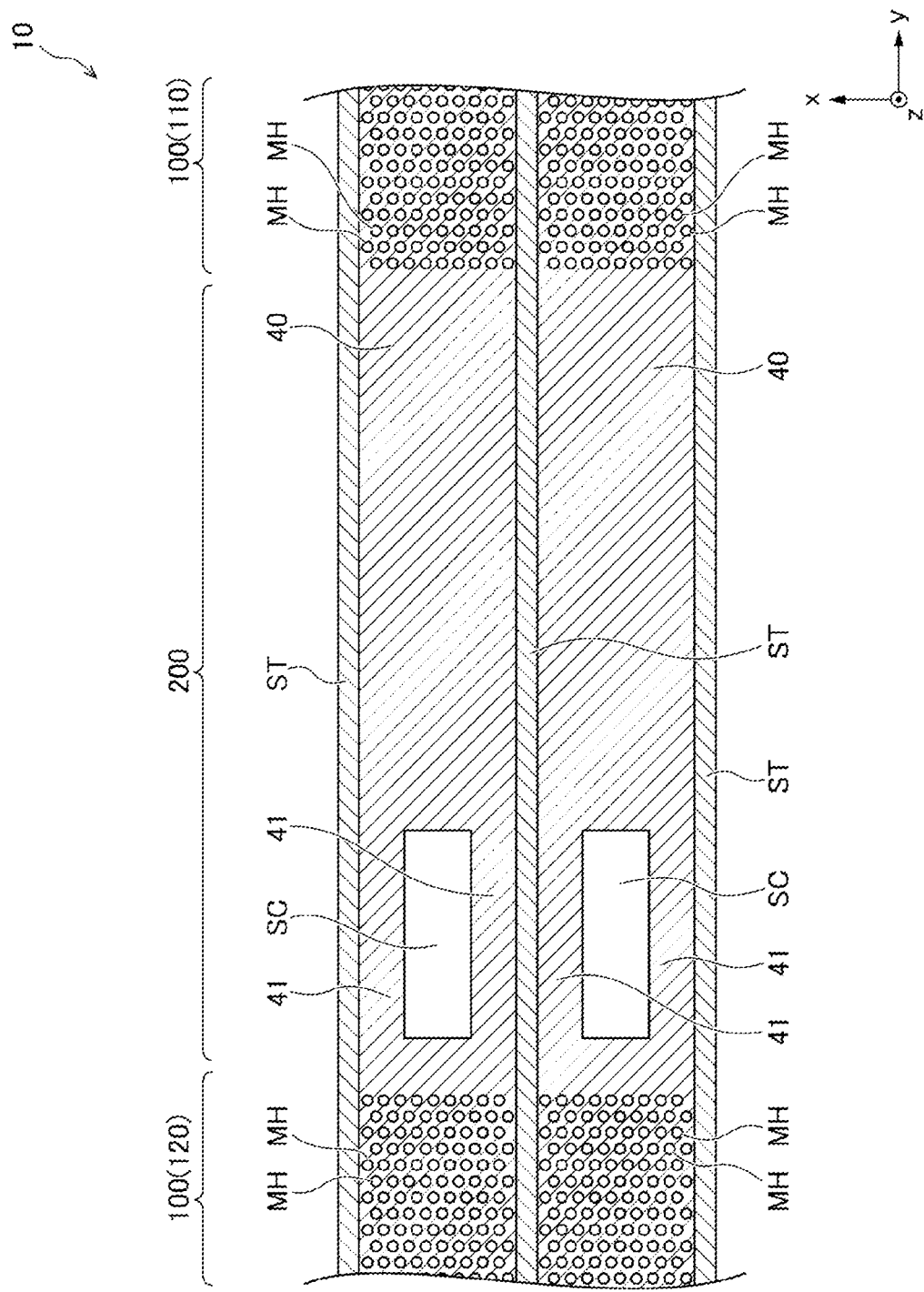
FIG. 23 schematically illustrates another cross-sectional view of the part of a semiconductor storage device according to a modification example.
Figure 24:
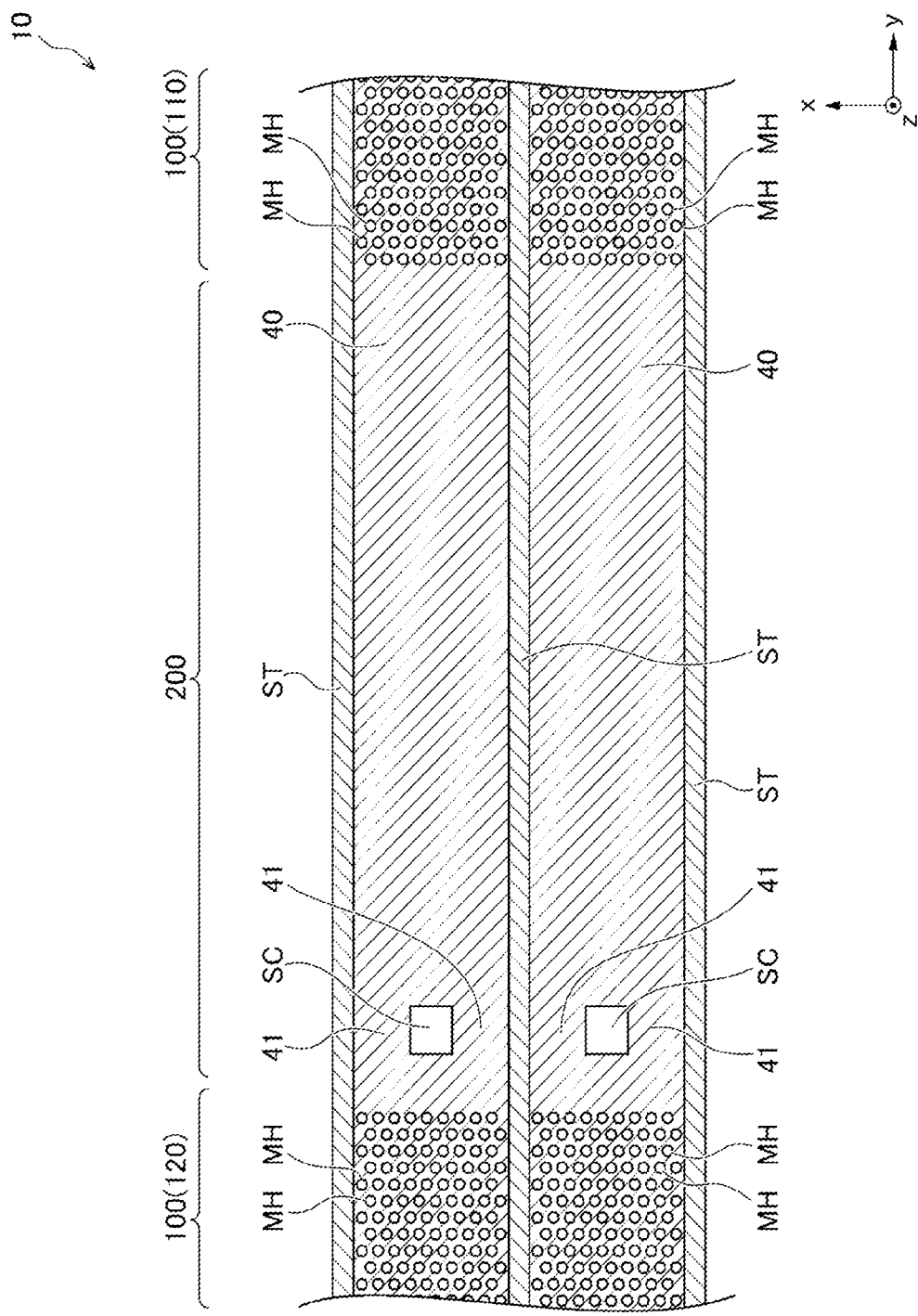
FIG. 24 schematically illustrates another cross-sectional view of the part of a semiconductor storage device according to a modification example.

FIG. 21 illustrates a cross-section when the semiconductor storage device 10 according to the modification example is cut at a position corresponding to that in FIG. 8. FIG. 22 illustrates a cross-section when the semiconductor storage device 10 according to the modification example is cut at a position corresponding to that in FIG. 9. FIG. 23 illustrates a cross-section when the semiconductor storage device 10 according to the modification example is cut at a position corresponding to that in FIG. 10. FIG. 24 illustrates a cross-section when the semiconductor storage device 10 according to the modification example is cut at a position corresponding to that in FIG. 11.

Figure 25:
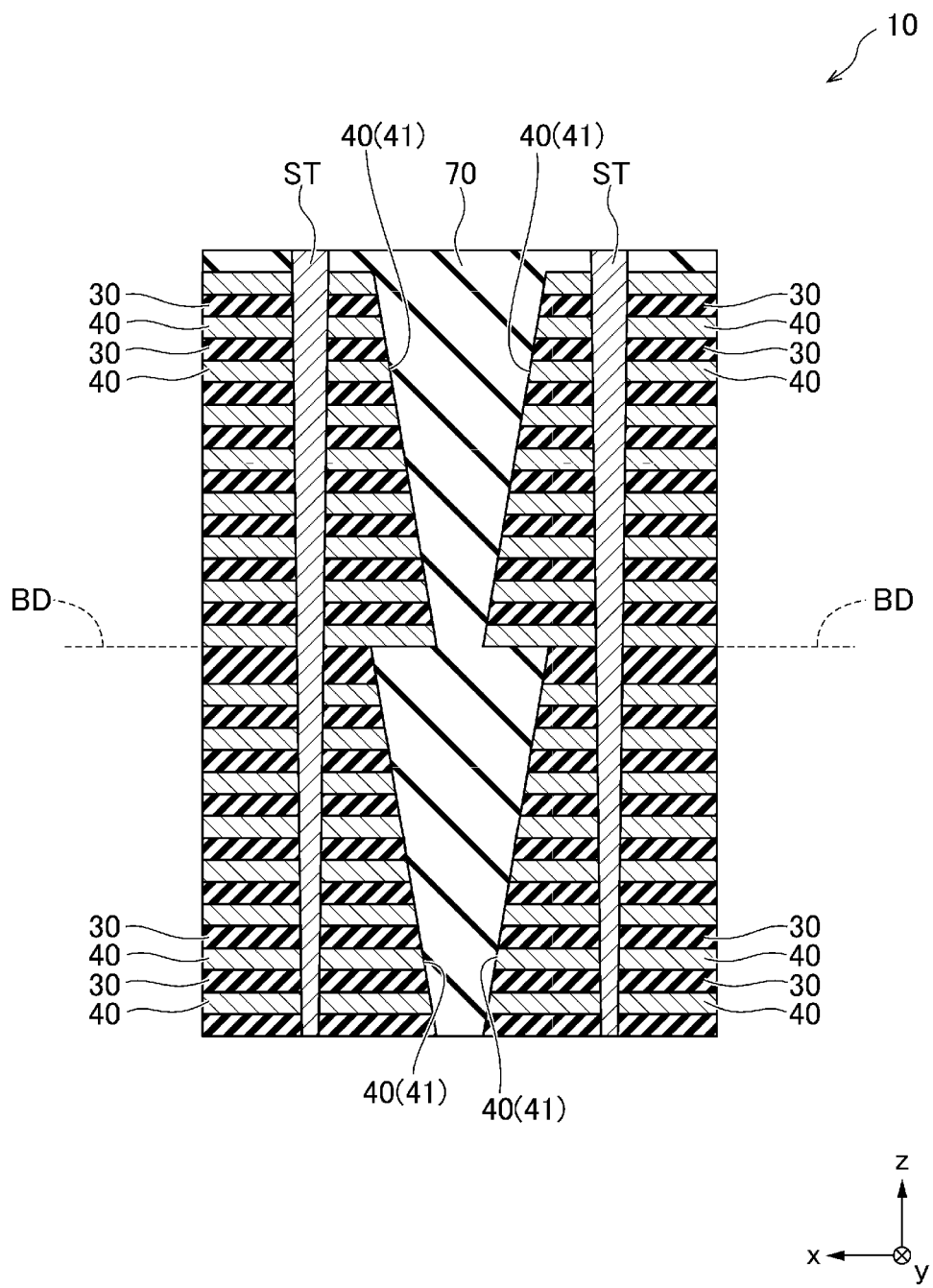
FIG. 25 schematically illustrates another cross-sectional view of the part of a semiconductor storage device according to a modification example.
Figure 26:
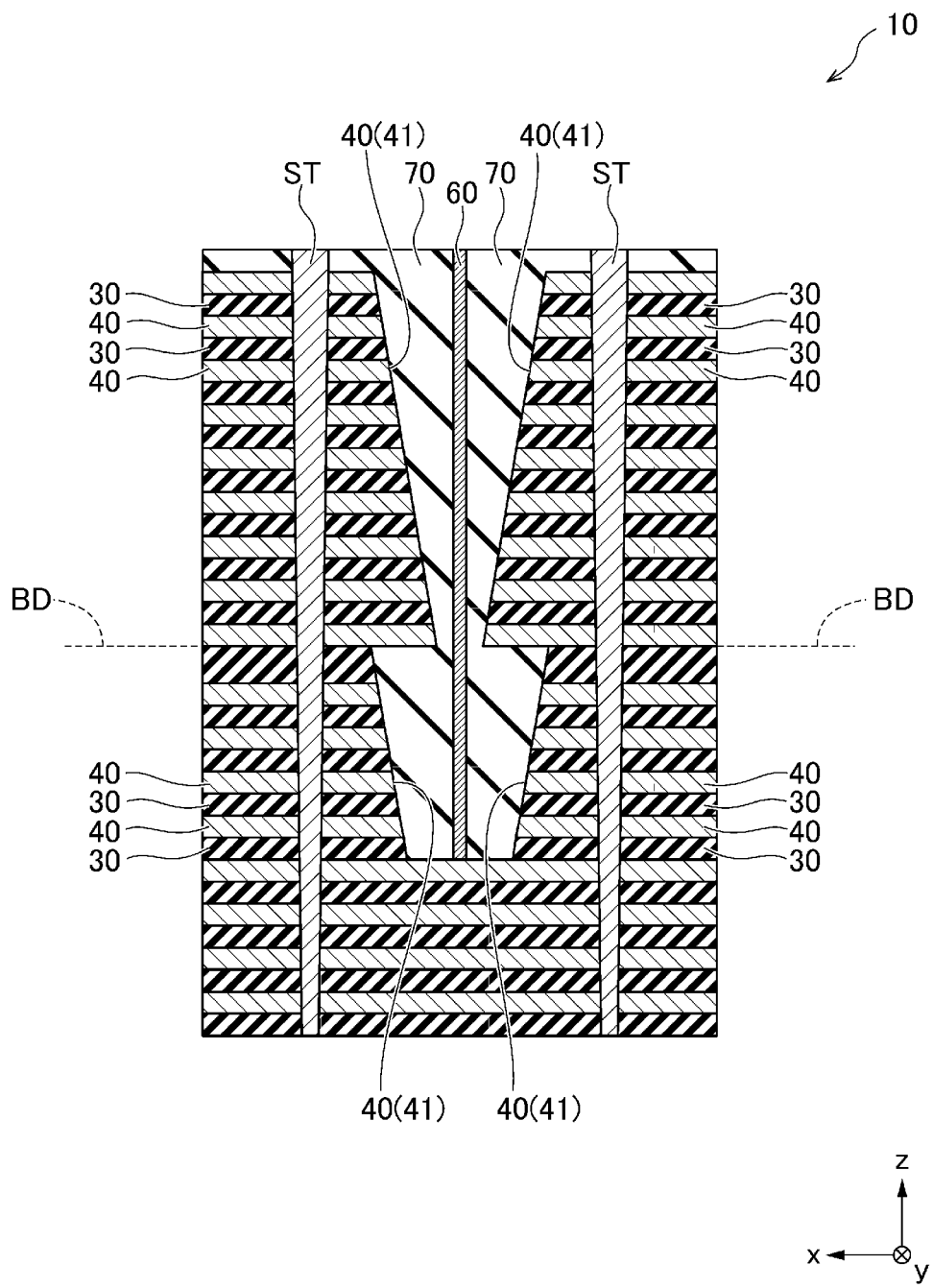
FIG. 26 schematically illustrates another cross-sectional view of the part of a semiconductor storage device according to a modification example.
Figure 27:
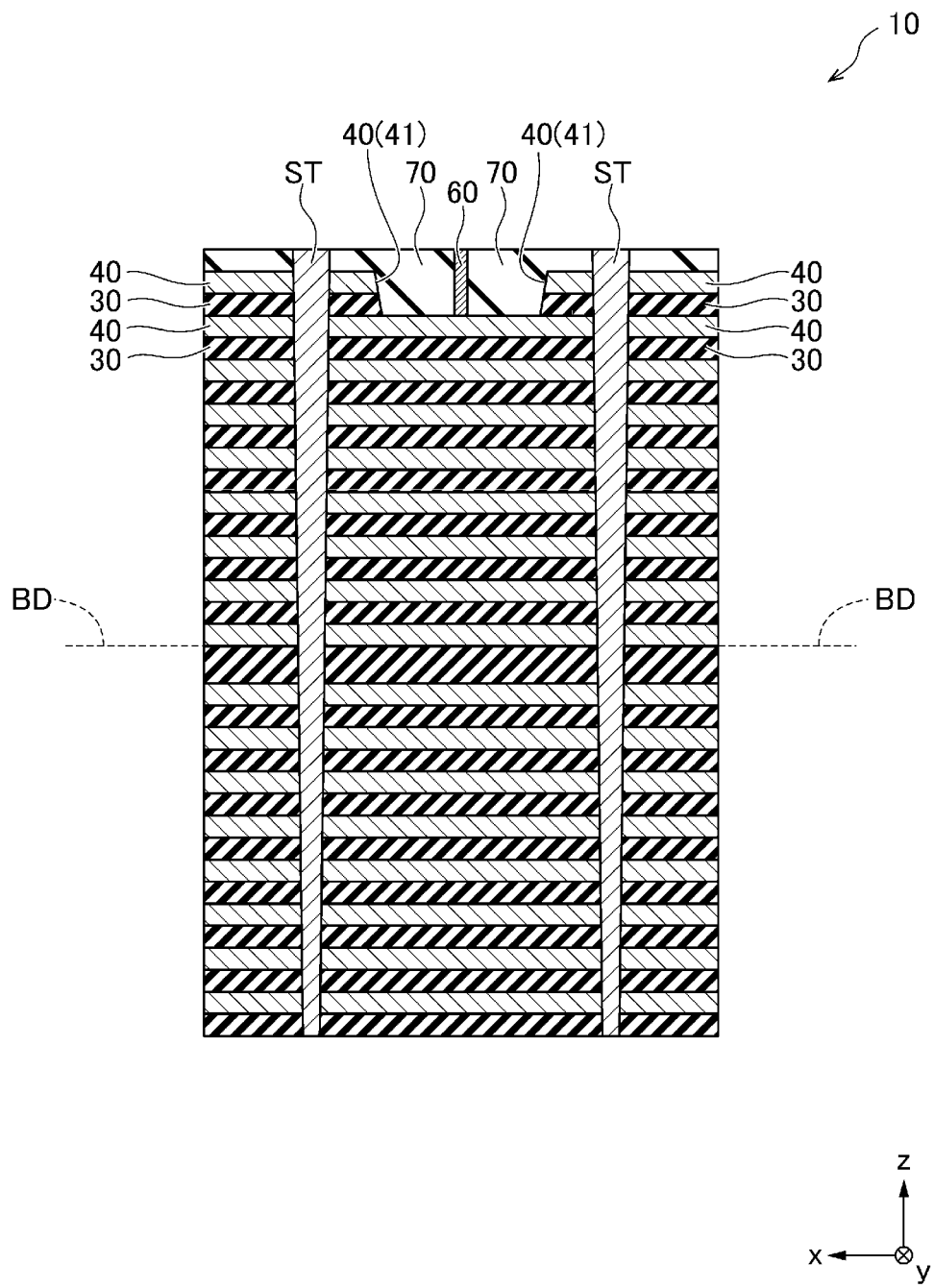
FIG. 27 schematically illustrates another cross-sectional view of the part of a semiconductor storage device according to a modification example.
Figure 28:
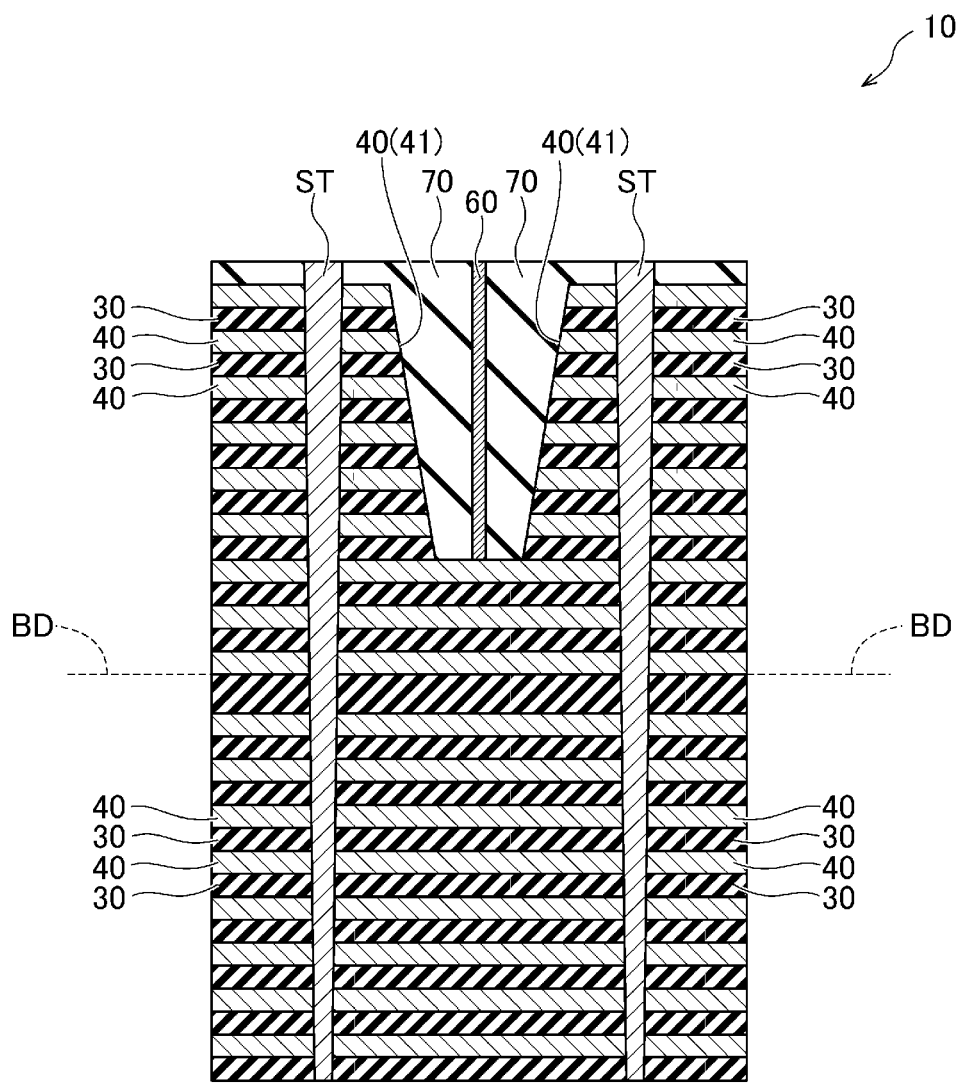
FIG. 28 schematically illustrates another cross-sectional view of the part of a semiconductor storage device according to a modification example.

FIG. 25 illustrates a cross-section when the semiconductor storage device 10 according to the modification example is cut at a position corresponding to that in FIG. 12. FIG. 26 illustrates a cross-section when the semiconductor storage device 10 according to the modification example is cut at a position corresponding to that in FIG. 13. FIG. 27 illustrates a cross-section when the semiconductor storage device 10 according to the modification example is cut at a position corresponding to that in FIG. 14. FIG. 28 illustrates a cross-section when the semiconductor storage device 10 according to the modification example is cut at a position corresponding to that in FIG. 15.

For example, as is clear from the comparison between FIG. 21 and FIG. 8, in this modification example, bridge portions are arranged between a couple of slits ST, at positions on both sides of the opening SC in the y direction, that is, at positions on both sides of the upper stepped portion 210A or the lower stepped portion 210B in the y direction. In the modification example with such a configuration as well, the same effects as those in the first embodiment can be achieved.

Figure 29:
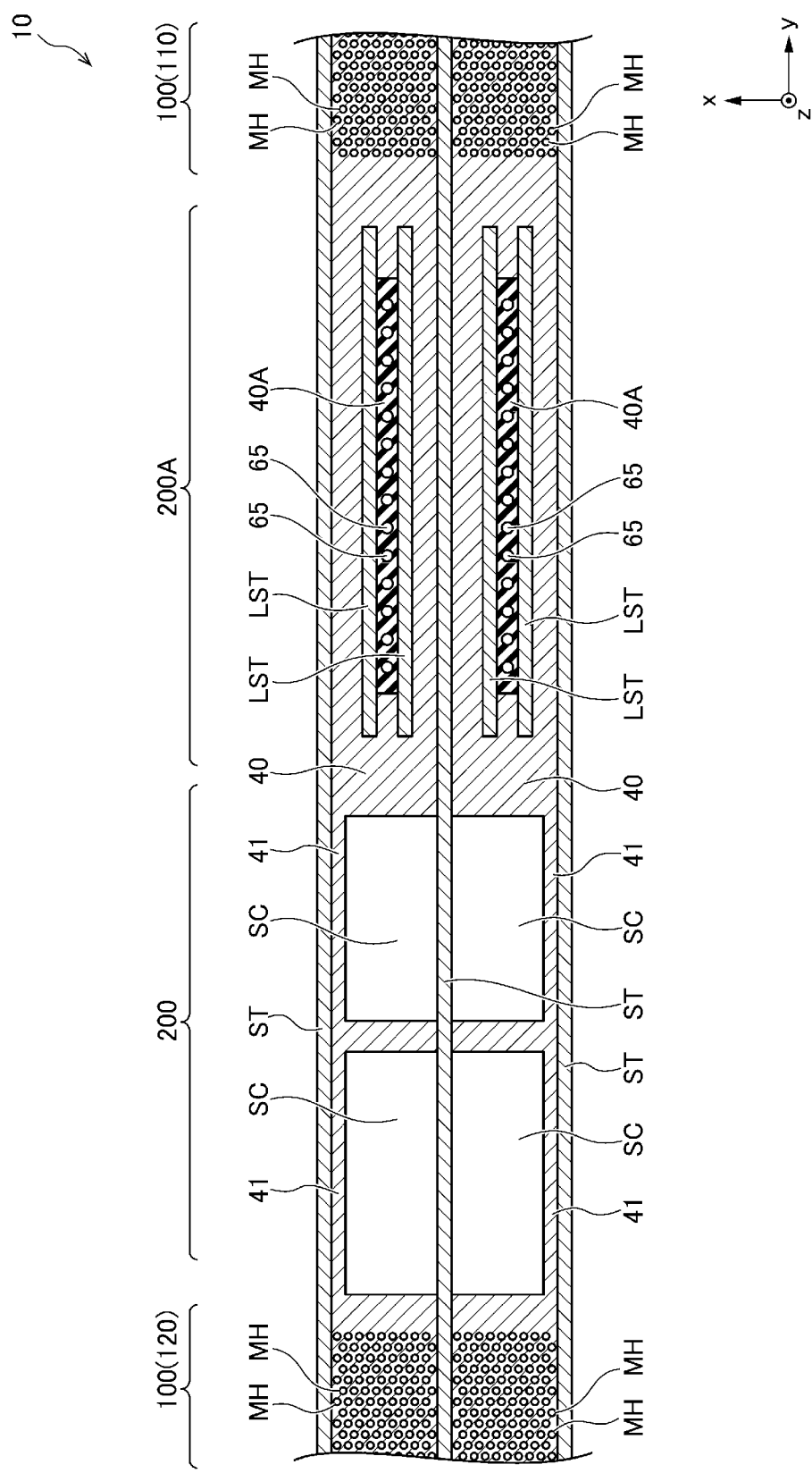
FIG. 29 schematically illustrates a cross-sectional view of a part of a semiconductor storage device according to another modification example.

Another modification example of the first embodiment will be described with reference to FIG. 29. FIG. 29 illustrates a cross-section when the semiconductor storage device 10 according to this modification example is cut at a position corresponding to that in FIG. 8. As illustrated in FIG. 29, in this modification example, a wiring region 200A is provided between the first stacked region 110 and the connection region 200.

In the wiring region 200A, a couple of slits LST is provided between the couple of slits ST. The slits LST extend along the y direction similarly to the slits ST, and are arranged along the x direction. The slits LST are formed through the insulator layers 30 and the conductor layers 40 stacked along the z direction.

A gap between the couple of slits LST aligned along the x direction is relatively narrow. Thus, between both the slits, the sacrificial layers 40A, which were not replaced by the conductor layers 40 in the replacement step, remain as they are. That is, between the couple of slits LST, the conductor layers 40 are not formed, and the insulator layers 30 and the sacrificial layers 40A are alternately stacked along the z direction.

Between the couple of slits LST, contacts 65 are formed through all of the stacked insulator layers 30 and the stacked sacrificial layers 40A. The z-direction end of the contact 65 is electrically connected to any of the conductor layers 40 of the stepped portion 210 through, for example, an upper layer wiring and the contact 60. The −z direction end of the contact 65 is electrically connected to, for example, peripheral circuits formed below the insulator layer 21. In the modification example with such a configuration as well, the same effects as those in the first embodiment can be achieved.

A second embodiment will be described. The semiconductor storage device 10 according to the second embodiment is different from that of the first embodiment in the configuration of the connection region 200. Hereinafter, points different from those in the first embodiment will be mainly described, and descriptions on points that are same as the first embodiment will be omitted.

Figure 30:
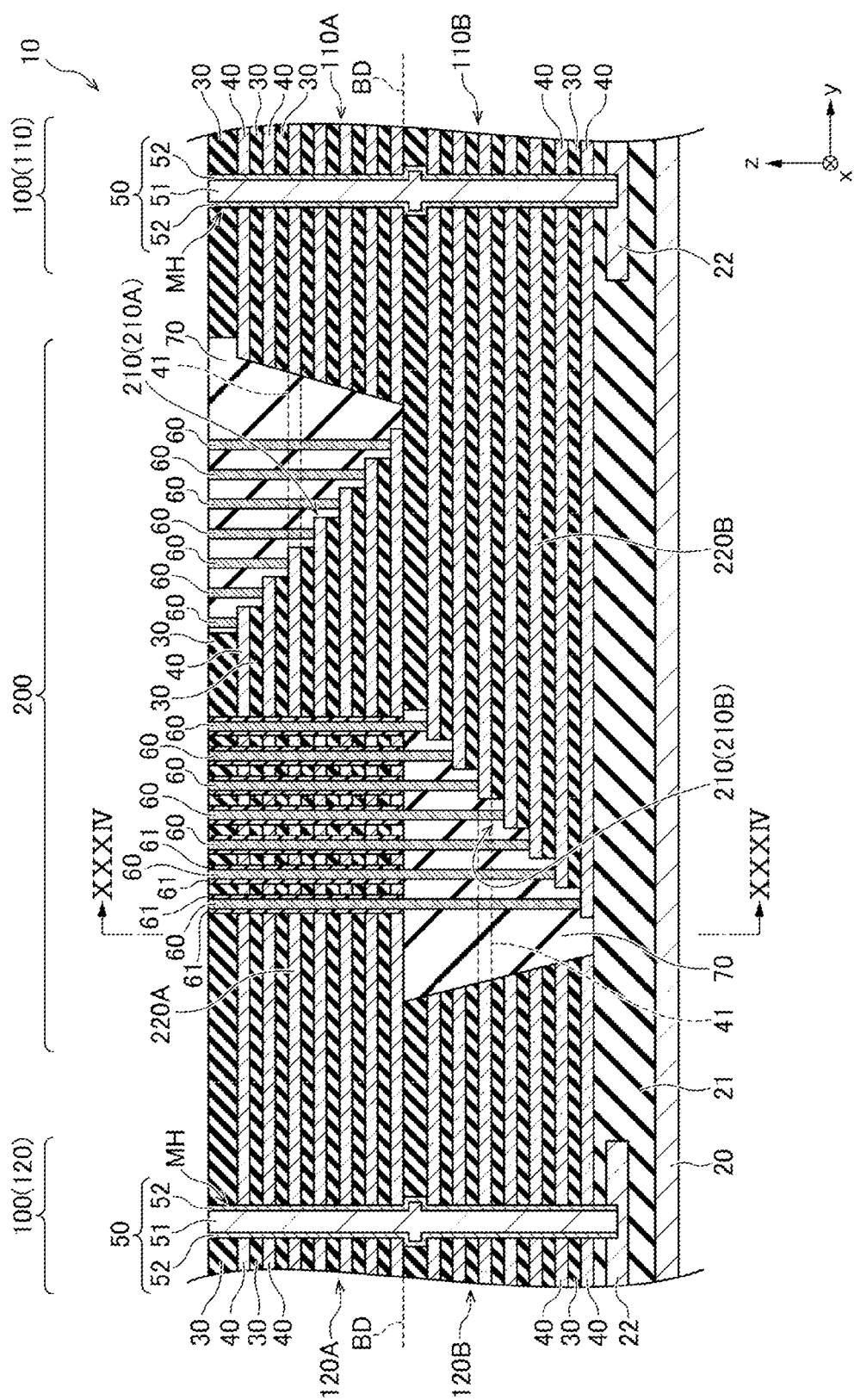
FIG. 30 schematically illustrates a cross-sectional view of a part of a semiconductor storage device according to a second embodiment.

FIG. 30 schematically illustrates the configuration of the semiconductor storage device 10 according to the second embodiment by the same viewpoint and method as those in FIG. 7. As illustrated in FIG. 30, in the semiconductor storage device 10 according to the second embodiment, the conductor layers 40 in the second stacked region 120 extend to the upper stepped portion 210A along the y direction, and are directly connected to the conductor layers 40 in the upper stepped portion 210A, respectively. As a result, a portion just above the lower stepped portion 210B is covered with the plurality of stacked conductor layers 40. In FIG. 30, at the position directly above the lower stepped portion 210B, a portion in which the conductor layers 40 are stacked (that is, a contact pass-through portion) is denoted by the reference numeral "220A."

In the second embodiment, an electrical connection between the upper stepped portion 210A and the second stacked region 120 is made without the plurality of bridge portions 41 unlike in the first embodiment.

Figure 31:
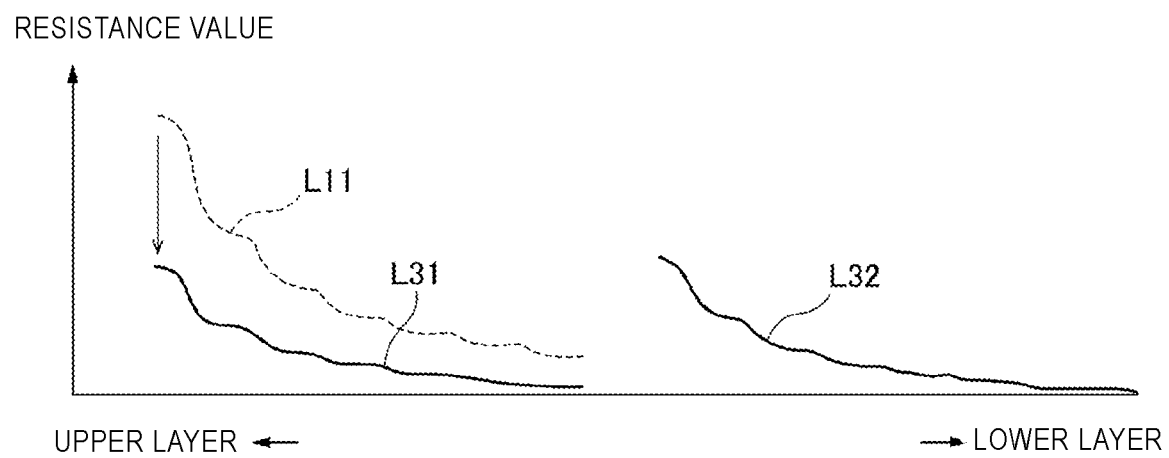
FIG. 31 is a graph illustrating electrical resistance values of bridge portions in a semiconductor storage device according to a second embodiment.

FIG. 31 schematically illustrates a distribution of electrical resistance values of the bridge portions 41 of the semiconductor storage device 10 according to the second embodiment in the same manner as in FIG. 18.

The line L31 in FIG. 31 indicates a distribution of electrical resistance values of the plurality of bridge portions 41 provided between the upper stepped portion 210A and the first stacked region 110. The line L32 indicates a distribution of electrical resistance values of the plurality of bridge portions 41 provided between the lower stepped portion 210B and the second stacked region 120. In FIG. 31, the line L11 (for the comparative example) of FIG. 17 is again illustrated as a dotted line for reference.

As is clear from the comparison between the configuration of the second embodiment illustrated in FIG. 30, and the configuration of the first embodiment illustrated in FIG. 7, the electrical resistance value distribution indicated by the line L31 of FIG. 31 is the same as the electrical resistance value distribution indicated by the line L21 of FIG. 18. The electrical resistance value distribution indicated by the line L32 of FIG. 31 is the same as the electrical resistance value distribution indicated by the line L22 of FIG. 18. It can also be said that the electrical resistance value distribution of the bridge portions 41 in the second embodiment corresponds to the case where electrical resistance values indicated by the line L23 of FIG. 18 are substantially zero.

In such a configuration, the same effects as those described in the first embodiment can be achieved. In the second embodiment, a difference between the electrical resistance value between the upper stepped portion 210A and the first stacked region 110, and the electrical resistance value between the lower stepped portion 210B and the second stacked region 120 is further reduced, so that the time required for writing may be further shorted. Thus, the performance of the semiconductor storage device 10 can be further improved.

As described above, in the semiconductor storage device 10 according to the second embodiment, above the lower stepped portion 210B in the connection region 200 (that is, the contact pass-through portion), the conductor layers 40 in the upper stepped portion 210A extend to the conductor layers 40 in the second stacked region 120. Below the upper stepped portion 210A in the connection region 200, the conductor layers 40 in the lower stepped portion 210B extend to the conductor layers 40 in the first stacked region 110. According to such a configuration, the same effects as those described in the first embodiment can be achieved.

In the second embodiment, the ends of the contacts 60 extending along the z direction are connected to the terrace portions of the stepped portion 210, respectively. Among these, all of the contacts 60 connected to the terrace portions of the lower stepped portion 210B are provided through the insulator layers 30 and the conductor layers 40 stacked above the boundary BD. In the portion above the boundary BD, an insulating film 61 is formed around the contact 60. The insulating film 61 insulates the contact 60 from the conductor layers 40.

Figure 32A:
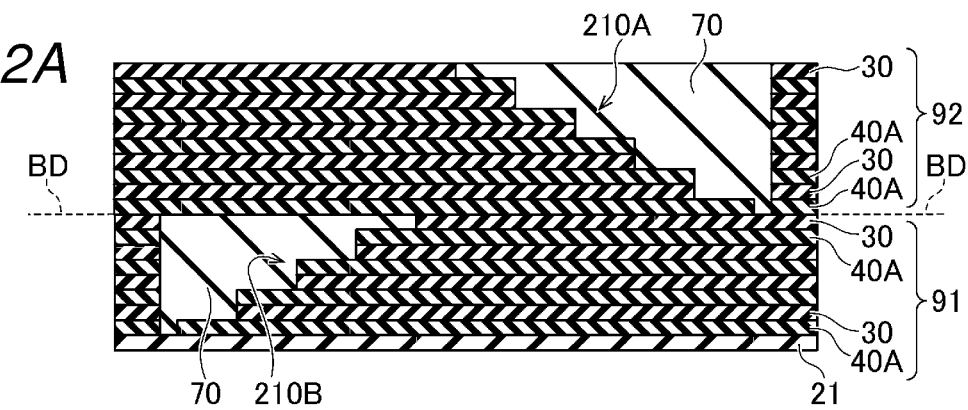
FIGS. 32A to 32C illustrate a method of manufacturing a semiconductor storage device according to a second embodiment.

In order to describe a method of forming the contacts 60 in the second embodiment, a method of manufacturing the semiconductor storage device 10 will be briefly described with reference to FIGS. 32A to 32C.

The method of manufacturing the semiconductor storage device 10 in the second embodiment is generally the same as that of the first embodiment until the above-described upper side stacking step is carried out. After the state illustrated in FIG. 20C is made through completion of the upper side stacking step, for the second embodiment, an upper staircase forming step is performed as in the following description.

<Upper Staircase Forming Step> In an upper staircase forming step of the second embodiment, anisotropic etching and slimming (trimming) of an etching mask are repeated to form the upper stepped portion 210A in the stacked body 92 in the same manner as in the first embodiment. Next, the periphery of the upper stepped portion 210A is filled with the insulator 70.

In the stacked body 92, an opening is not formed at a position directly above the lower stepped portion 210B unlike in the first embodiment. Thus, in the portion on the z direction side of the lower stepped portion 210B, the stacked insulator layers 30 and the stacked sacrificial layers 40A are maintained as they are. FIG. 32A schematically illustrates a state in which the upper staircase forming step is completed. In the second embodiment, after the upper stepped portion 210A is formed, the memory pillars 50 and the like are formed, but in FIGS. 32A to 32C, the memory pillars 50 and the like are omitted from the illustration.

<Contact Forming Step> After the upper staircase forming step is completed, the slits ST (see, e.g., FIG. 4) are formed in the stacked bodies 91 and 92. Next, the sacrificial layers in the stacked bodies 91 and 92 are replaced by the conductor layers 40 through wet etching or the like via the corresponding slits ST. When the replacement is completed, the inside of the slit ST is filled with, for example, a conductive material such as tungsten or polysilicon through, for example, an insulating spacer made of silicon oxide.

After the replacement is completed, in the contact forming step of the second embodiment, in the stacked body 92, a plurality of openings H1 is formed through the insulator 70 along the z direction by etching at a position directly above the upper stepped portion 210A. The opening H1 is an opening for forming the contact 60. Here, in the stacked body 92, openings for forming the contacts 60 are not formed at a position directly above the lower stepped portion 210B.

Next, the insulating film 61 is formed on the inner surface of the opening H1. FIG. 32B schematically illustrates the state where the opening H1 and the insulating film 61 are formed.

In order to prevent the opening H1 from being further formed in the portion on the −z direction side beyond the boundary BD, it is desirable that a layer serving as a stopper is provided in advance at the position of the boundary BD. As for such a layer, a layer made of, for example, silicon nitride may be used.

Subsequently, a plurality of openings is formed through the insulator 70 along the z direction by etching at each of the position directly above the upper stepped portion 210A, and the position directly above the lower stepped portion 210B. The etching for "the position directly above the lower stepped portion 210B" between them is performed through the previously formed openings H1. Next, each of the openings, including the openings H1, is filled with, for example, a conductor such as tungsten so that the plurality of contacts 60 is formed. FIG. 32C schematically illustrates a state in which the formation of the contacts 60 is completed.

According to the above-described method, in the second embodiment, the contacts 60 connected to terrace portions of each of the upper stepped portion 210A and the lower stepped portion 210B may be formed in the same manner as in the related art.

The formation of the contacts 60 may be performed by a method different from the above-described method. For example, the openings H1, which are to be formed in the stacked body 92 in order to form the contacts 60 at the inside, may be formed in a step prior to replacement.

Figure 32B:
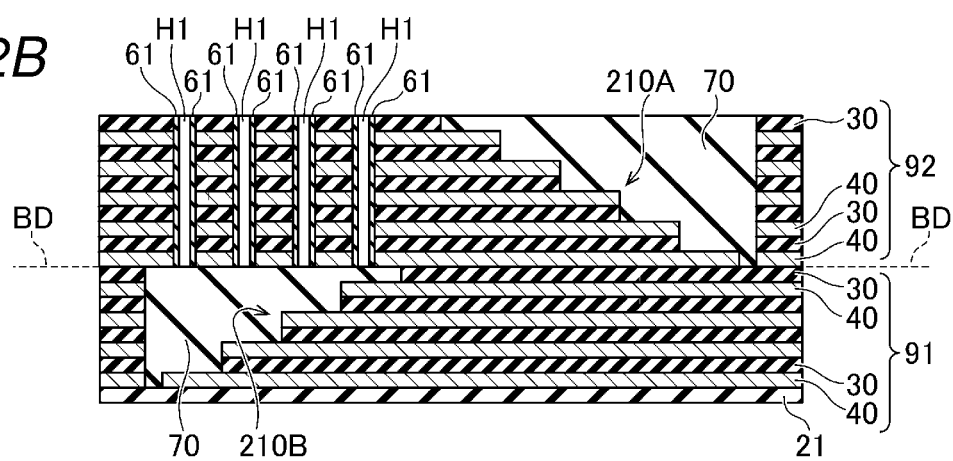
Figure 32C:
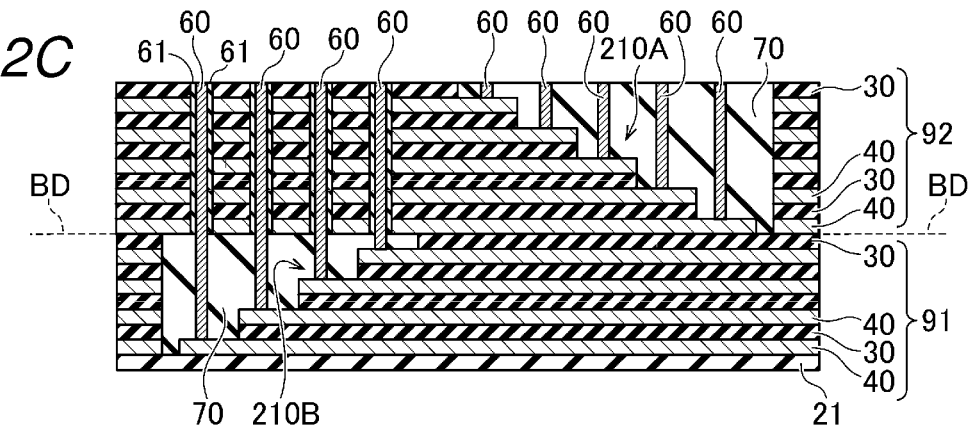

In this case, after the openings H1 are formed at the same positions as those in FIG. 32B, the insulating film 61 may be formed on the inner peripheral surface of each opening H1, and the inside may be further filled with a sacrificial material. Then, after the formation of the slits ST, and the replacement of the sacrificial layers 40A in the stacked bodies 91 and 92 with the conductor layers 40 have been performed, the sacrificial material filling inside the opening H1 may be removed. As for subsequent steps, the same steps as those described with reference to FIG. 32C may be employed.

Figure 33:
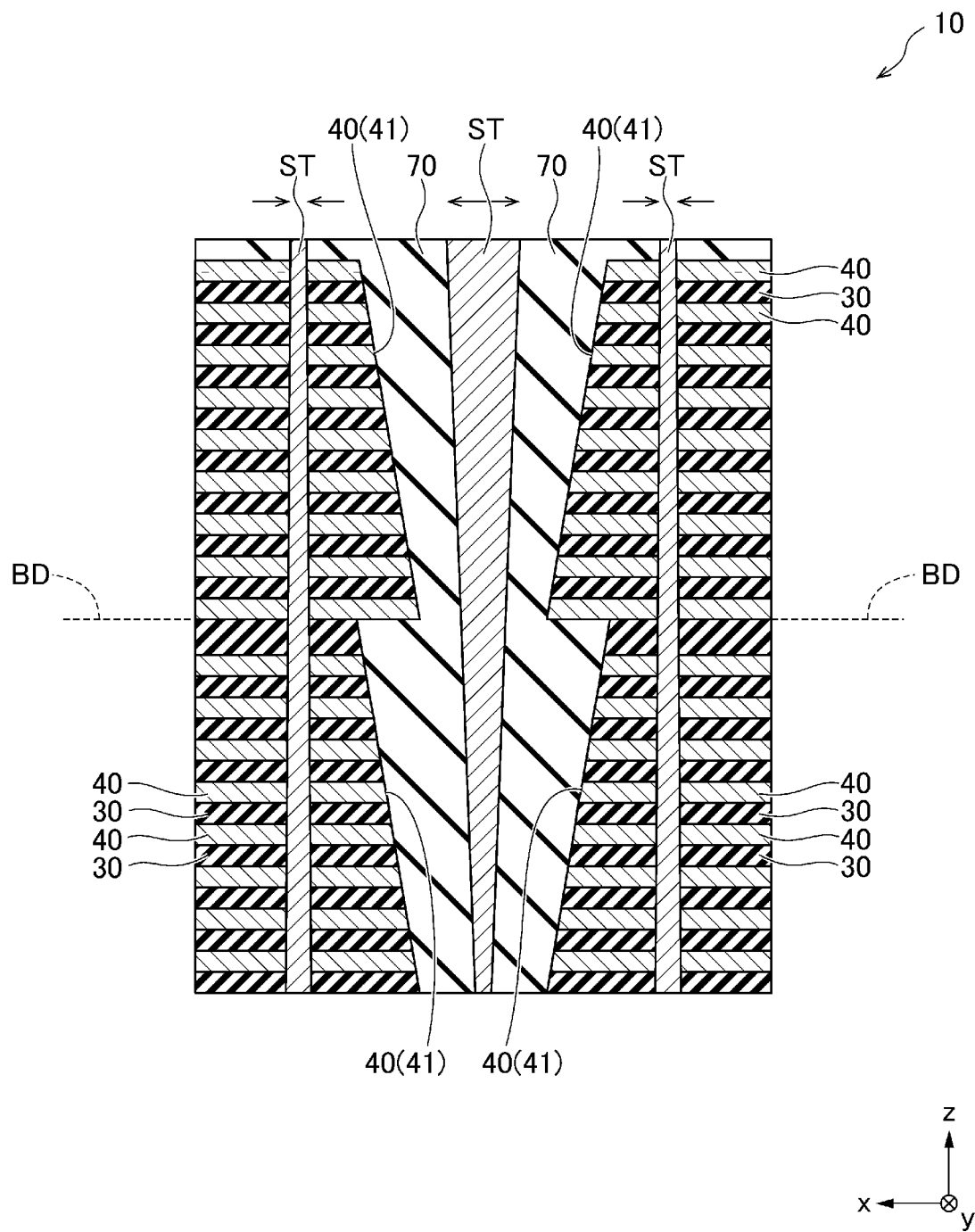
FIG. 33 illustrates aspects related to a problem occurring in the vicinity of a slit.

Another advantage of the configuration of the second embodiment will be described. FIG. 33 schematically illustrates a cross-section of the semiconductor storage device 10 having the same configuration as that of the first embodiment from the same viewpoint as that in FIG. 12. In the configuration of the FIG. 33, the slit ST illustrated at the center in the x direction is formed such that almost the entire slit ST in the z direction divides the insulator 70 in the x direction.

After the above-described upper staircase forming step is completed, when the sacrificial layers 40A in the stacked bodies 91 and 92 are replaced by the conductor layers 40, a difference may occur between the shrinkage amount of the insulator 70, and the shrinkage amount of the conductor layers 40 and the like in the first stacked region 110 or the second stacked region 120. As a result, as illustrated in FIG. 33, the width dimension of the central slit ST in the x direction may not be uniform, and the corresponding width dimension may become larger in the z direction. To the contrary, in the slits ST in the vicinity of the corresponding slit ST, the width dimension may become smaller in the z direction.

Figure 34:
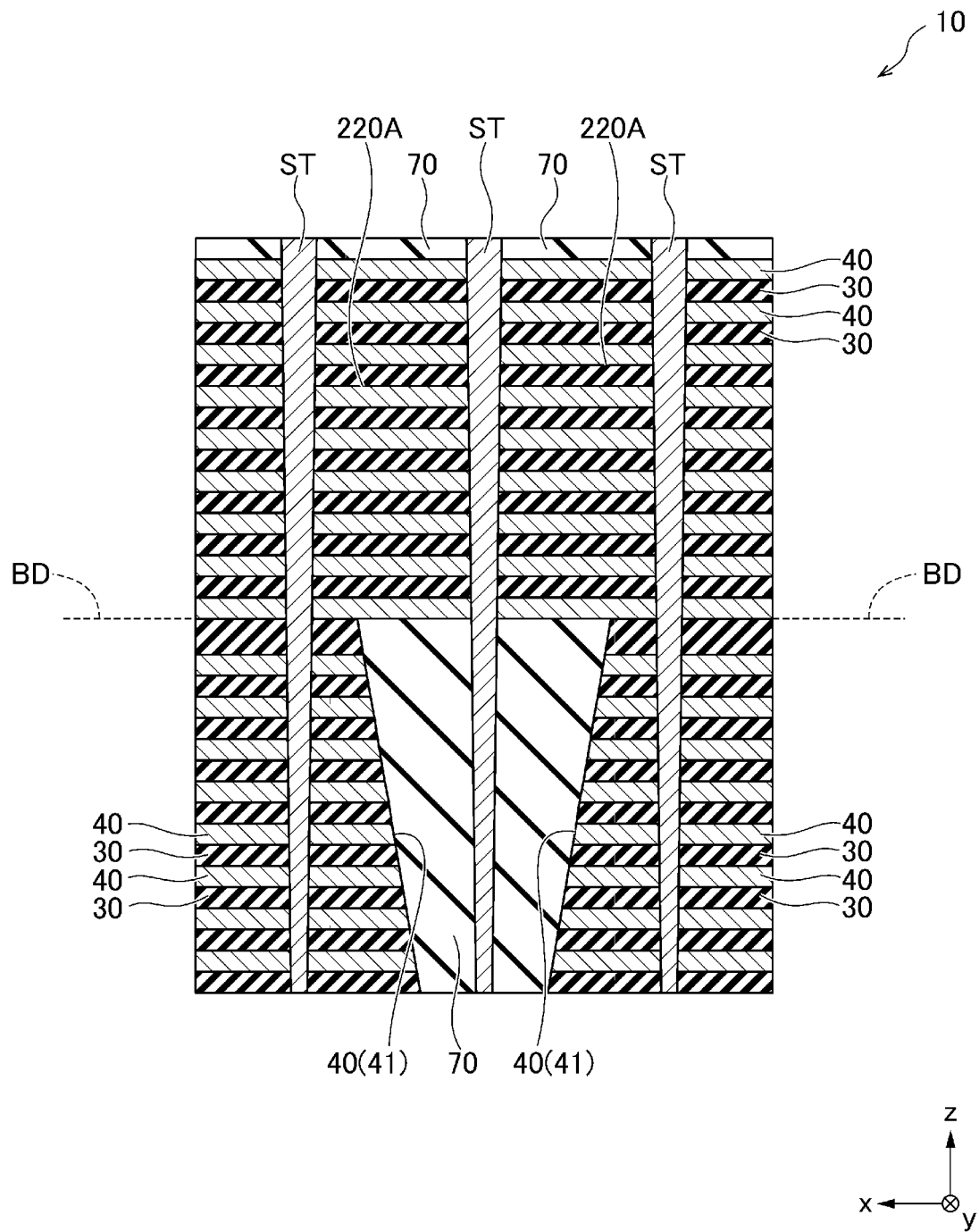
FIG. 34 schematically illustrates a cross-section taken along XXXIV-XXXIV of FIG. 30.

FIG. 34 illustrates a cross-sectional shape of the semiconductor storage device 10 according to the present embodiment, from the same viewpoint as that in FIG. 33. The corresponding cross-section is a cross-section taken along XXXIV-XXXIV in FIG. 30. As illustrated in FIG. 34, in the present embodiment, there is no slit ST that divides the insulator 70 over the entire range in the z direction. As illustrated in the cross-section of FIG. 34, the portion of the slit ST on the z direction side of the boundary BD is formed so as not to divide the insulator 70, but divide the portion (the portion denoted by the reference numeral "220A" in FIG. 30) in which the conductor layers 40 are stacked.

In such a configuration, local expansion or shrinkage of the slit ST by the difference in the shrinkage amount is unlikely to occur. For that reason, the width dimension of the slit ST may be almost uniform in the entire range in the z direction.

A third embodiment will be described. The semiconductor storage device 10 according to the third embodiment is different from that of the second embodiment in the configuration of the connection region 200.

Hereinafter, points different from those in the second embodiment will be mainly described, and descriptions on points that are same as the second embodiment will be omitted.

Figure 35:
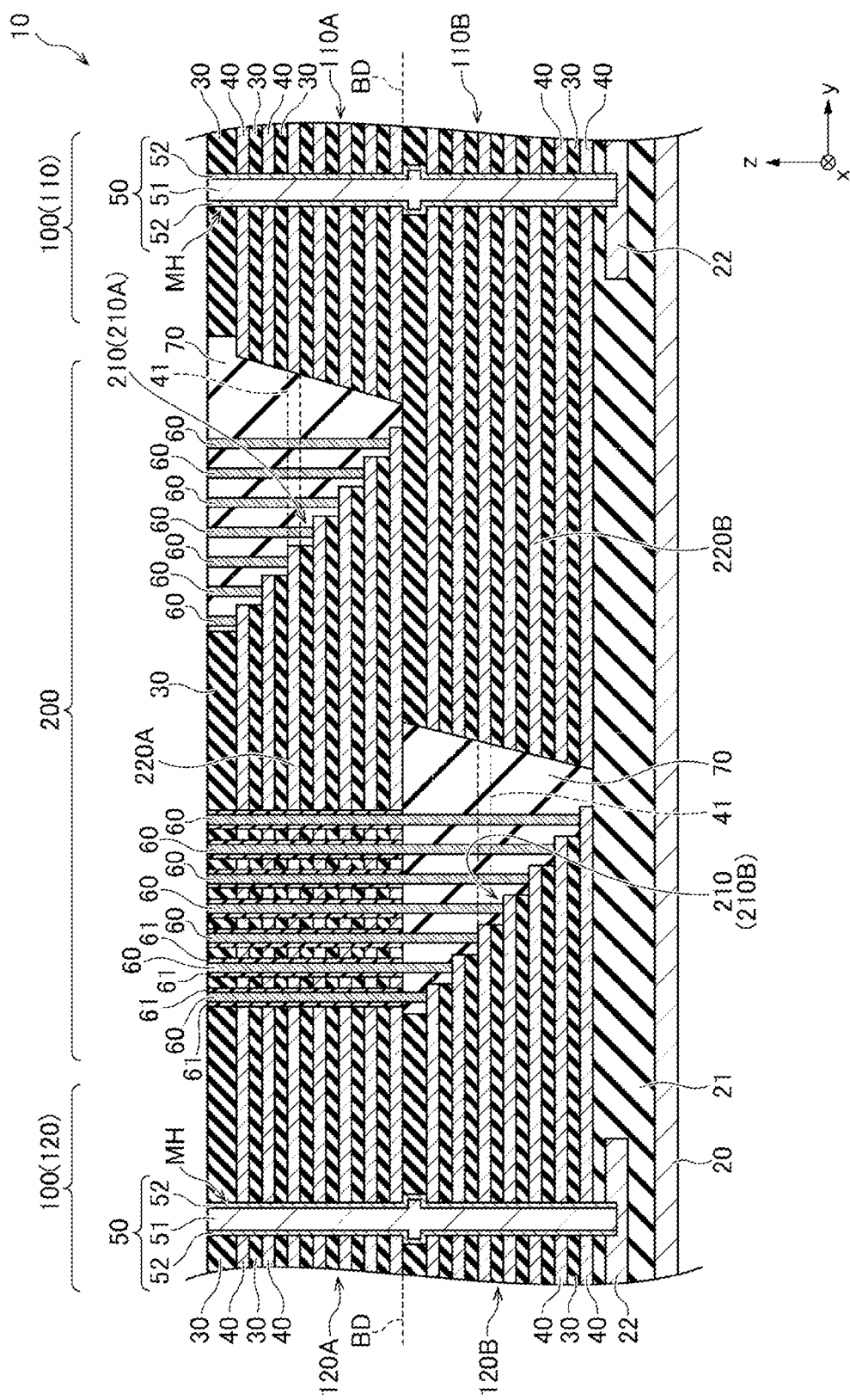
FIG. 35 schematically illustrates a cross-sectional view of a part of a semiconductor storage device according to a third embodiment.

FIG. 35 illustrates a cross-sectional shape of the semiconductor storage device 10 according to the third embodiment from the same viewpoint as that in FIG. 30. As illustrated in FIG. 35, the semiconductor storage device 10 according to the third embodiment has a configuration in which the shape of the lower stepped portion 210B in FIG. 30 is inverted to be symmetrical to the x-z plane.

From the conductor layers 40 in the lower stepped portion 210B, the bridge portions 41 are formed, respectively, to extend in the y direction. The bridge portions 41 are connected to the conductor layers 40 stacked in a portion (a portion denoted by the reference numeral "220B") just below the upper stepped portion 210A, respectively. According to such a configuration, each of the conductor layers 40 in the lower stepped portion 210B is electrically connected to each of the conductor layers 40 in the first stacked region 110B.

The conductor layers 40 in the lower stepped portion 210B are formed by pulling the conductor layers 40 in the second stacked region 120B, respectively, as they are, in the y direction in a stepwise form. That is, the conductor layers 40 in the lower stepped portion 210B are directly and integrally connected to the conductor layers 40 in the second stacked region 120B, respectively. Thus, the conductor layers 40 in the lower stepped portion 210B are electrically connected to the conductor layers 40 in the second stacked region 120B, respectively.

In the semiconductor storage device 10 according to the third embodiment, in the connection region 200, the bridge portion 41 extends along the y direction. The bridge portion 41 electrically connects one of the conductor layers 40 in the lower stepped portion 210B to one of the conductor layers 40 in the first stacked region 110. That is, one of the conductor layers 40 in the lower stepped portion 210B does not extend to the conductor layer 40 in the first stacked region 110, but is electrically connected to one of the conductor layers 40 in the first stacked region 110 by the bridge portion 41 (that is, one of the conductor layers 40 in the first bridge portion).

A third bridge portion may be formed on both sides of the lower stepped portion 210B in the x direction between the couple of slits ST, or may be formed on one side of the lower stepped portion 210B. By providing such a third bridge portion, it is possible to secure an electrical connection between the lower stepped portion 210B and the first stacked region 110.

The configuration of the portion on the z direction side of the boundary BD is the same as the configuration in the second embodiment. Thus, in the connection region 200, in the portion above the lower stepped portion 210B, the conductor layers 40 in the upper stepped portion 210A are formed to extend to the conductor layers 40 in the second stacked region 120.

According to the above-described configuration, the same effects as those described for the first embodiment or the second embodiment can be achieved. As for a method of manufacturing the semiconductor storage device 10 according to the third embodiment, the same manufacturing method described for the second embodiment may be used.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
a first stacked region including a plurality of word lines stacked in a first direction;
a first plurality of memory pillars extending through the first stacked region in the first direction;
a second stacked region including the plurality of word lines and aligned with the first stacked region along a second direction intersecting the first direction;
a second plurality of memory pillars extending through the second stacked region in the first direction; and
a third stacked region including the plurality of word lines, the third stacked region being between the first stacked region and the second stacked region in the second direction, wherein
the third stacked region includes a first stacked subregion and a second stacked subregion above the first stacked subregion in first direction,
the first stacked subregion includes:
  a first stair portion that is formed with a first part of the plurality of word lines and is adjacent to the second stacked region in the second direction; and
  a first bridge portion adjacent to the first stair portion in a third direction intersecting the first direction and the second direction, the first stair portion ascending toward the first stacked region,
the second stacked subregion includes:
  a first contact pass-through portion through which a plurality of first contacts extending from the first part of the plurality of word lines in the first stair portion passes;
  a trapezoidal portion that is formed with a second part of the plurality of word lines above the first part in the first direction, between the first contact pass-through portion and the first stacked region in the second direction, the trapezoidal portion comprising a slope portion formed on a first side of the trapezoidal portion in the second direction and facing the second stacked region and a second stair portion formed on a second side of the trapezoidal portion opposite to the first side in the second direction and facing the first stacked region, the slope portion being steeper than the second stair portion;
  a second bridge portion adjacent to the second stair portion in the third direction, the second stair portion ascending toward the second stacked region; and
  a second contact pass-through portion through which a plurality of second contracts extending from the second part of the plurality of word lines in the second stair portion passes,
one of the plurality of word lines in the second stair portion is connected to one of the plurality of word lines in the first stacked region through one of the plurality of word lines in the second bridge portion, and
no memory pillar is provided between the first stacked subregion and the second stacked subregion in the second direction.

2. The semiconductor storage device according to claim 1, wherein one of the plurality of word lines in the first stair portion is connected to one of the plurality of word lines in the second stacked region through one of the plurality of word lines in the first bridge portion.

3. The semiconductor storage device according to claim 1, wherein one of the plurality of word lines in the first stair portion extends to the first stacked region in the second direction under the second stair portion.

4. The semiconductor storage device according to claim 1, wherein none of the plurality of word lines in the second stair portion extend over the first stair portion.

5. The semiconductor storage device according to claim 1, wherein one of the plurality of word lines in the second stair portion extends to the second stacked region in the second direction over the first stair portion.

6. The semiconductor storage device according to claim 1, wherein the first bridge portion is on both sides of the first stair portion in the third direction.

7. The semiconductor storage device according to claim 1, wherein the second bridge portion is on both sides of the second stair portion in the third direction.

8. The semiconductor storage device according to claim 1, wherein the slope portion is substantially vertical.

9. A semiconductor storage device, comprising:
a first stack of word lines stacked in a thickness direction;
a second stack of word lines stacked in the thickness direction above the first stack;
a plurality of first memory pillars extending through the first and second stacks in the thickness direction in a first memory region;
a plurality of second memory pillars extending through the first and second stacks in the thickness direction in a second memory region;
a plurality of first contacts extending to the first stack of word lines in the thickness direction; and
a plurality of second contacts extending to the second stack of word lines in the thickness direction, wherein
the first stack of word lines has a first opening between the first memory region and the second memory region, the first opening forming a first stair structure connected to the plurality of first contacts, the first stair structure ascending toward a first portion of the first stack which is located in the first memory region,
the second stack of word lines has a second opening between the first memory region and the second memory region and forms a trapezoidal structure between the second opening and the second memory region, the trapezoidal structure comprising a slope formed on a first side of the trapezoidal portion and facing the second memory region and a second stair structure formed on a second side of the trapezoidal portion opposite to the first side and facing the first memory region, the slope being steeper than the second stair structure, the second stair structure being connected to the plurality of second contacts, the second stair structure ascending toward a second portion of the second stack which is located in the second memory region, the second opening being separated from the first opening, and
no memory pillar is provided between the first opening and the second opening.

10. The semiconductor storage device according to claim 9, wherein the second stack of word lines has a third opening above the first stair structure and the plurality of first contacts extend through the third opening.

11. The semiconductor storage device according to claim 10, wherein a lower end of the third opening is smaller than an upper end of the first opening.

12. The semiconductor storage device according to claim 9, wherein
the second stack of word lines has a plurality of third openings above the first stair structure, and
the plurality of first contacts extend through the plurality of third openings, respectively.

13. The semiconductor storage device according to claim 9, wherein
one of the word lines in the first stack has a first part provided in the first memory region, a second part provided in the second memory region, and a third part provided in a region between the first memory region and the second memory region,
the first part and the second part are electrically connected via the third part,
one of the conductor layers in the second stack has a fourth part provided in the first memory region, a fifth part provided in the second memory region, and a sixth part provided in a region between the first memory region and the second memory region, and
the fourth part and the fifth part are electrically connected via the sixth part.

14. The semiconductor storage device according to claim 1, wherein each of the first, second, and third stacked regions further includes a first select gate line below the plurality of word lines in the first direction and a second select gate line above the plurality of word lines in the first direction.

15. The semiconductor storage device according to claim 9, further comprising:
a first select gate line below the first stack in the thickness direction; and
a second select gate line above the second stack in the thickness direction.

16. The semiconductor storage device according to claim 1, wherein no contact is provided on the slope portion.

17. The semiconductor storage device according to claim 16, wherein no memory pillar is provided between the one of the first contacts that has the shortest length in the first direction and the one of the second contacts that has the shortest length in the first direction.

18. The semiconductor storage device according to claim 9, wherein no contact is provided on the slope.

19. The semiconductor storage device according to claim 18, wherein no memory pillar is provided between the one of the first contacts that has the shortest length in the thickness direction and the one of the second contacts that has the shortest length in the thickness direction.

20. The semiconductor storage device according to claim 9, wherein the slope is substantially vertical.

* * * * *